US012111549B2

United States Patent
Douyou

(10) Patent No.: US 12,111,549 B2
(45) Date of Patent: Oct. 8, 2024

(54) DISPLAY DEVICE

(71) Applicant: Japan Display Inc., Tokyo (JP)

(72) Inventor: Mamoru Douyou, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/461,601

(22) Filed: Sep. 6, 2023

(65) Prior Publication Data

US 2023/0418121 A1 Dec. 28, 2023

Related U.S. Application Data

(63) Continuation of application No. PCT/JP2022/007937, filed on Feb. 25, 2022.

(30) Foreign Application Priority Data

Mar. 9, 2021 (JP) .................................. 2021-037461

(51) Int. Cl.
*G02F 1/1362* (2006.01)
*G02F 1/1368* (2006.01)

(52) U.S. Cl.
CPC .. *G02F 1/136286* (2013.01); *G02F 1/136209* (2013.01); *G02F 1/1368* (2013.01)

(58) Field of Classification Search
CPC .................................................. G02F 1/1362
See application file for complete search history.

(56) References Cited

U.S. PATENT DOCUMENTS

| 6,330,044 | B1 * | 12/2001 | Murade | G02F 1/136209 |
|---|---|---|---|---|
| | | | | 349/110 |
| 2005/0078240 | A1 * | 4/2005 | Murade | G02F 1/136209 |
| | | | | 349/110 |
| 2016/0209719 | A1 * | 7/2016 | Yamaguchi | G02F 1/13439 |
| 2017/0033127 | A1 * | 2/2017 | Zhao | H01L 29/78606 |
| 2018/0122827 | A1 * | 5/2018 | Park | H01L 27/1244 |
| 2018/0373106 | A1 * | 12/2018 | Nagasawa | G02F 1/1343 |

OTHER PUBLICATIONS

International Search Report mailed on Apr. 26, 2022 for the corresponding PCT Application No. PCT/JP2022/007937, with English machine translation.

* cited by examiner

*Primary Examiner* — Sang V Nguyen
(74) *Attorney, Agent, or Firm* — Michael Best & Friedrich LLP

(57) ABSTRACT

According to one embodiment, in a display device, one of the gate electrodes includes a first linear portion extending along the second direction, and a first projection portion projecting from the first linear portion and extending along the first direction, one of the first light shielding layers includes a second linear portion extending along the second direction, and a second projection portion projecting from the second linear portion and extending along the first direction, the first linear portion overlaps the second linear portion, the first projection portion overlaps the second projection portion, and the first projection portion and the second projection portion overlap at least one of the plurality of select lines.

5 Claims, 18 Drawing Sheets

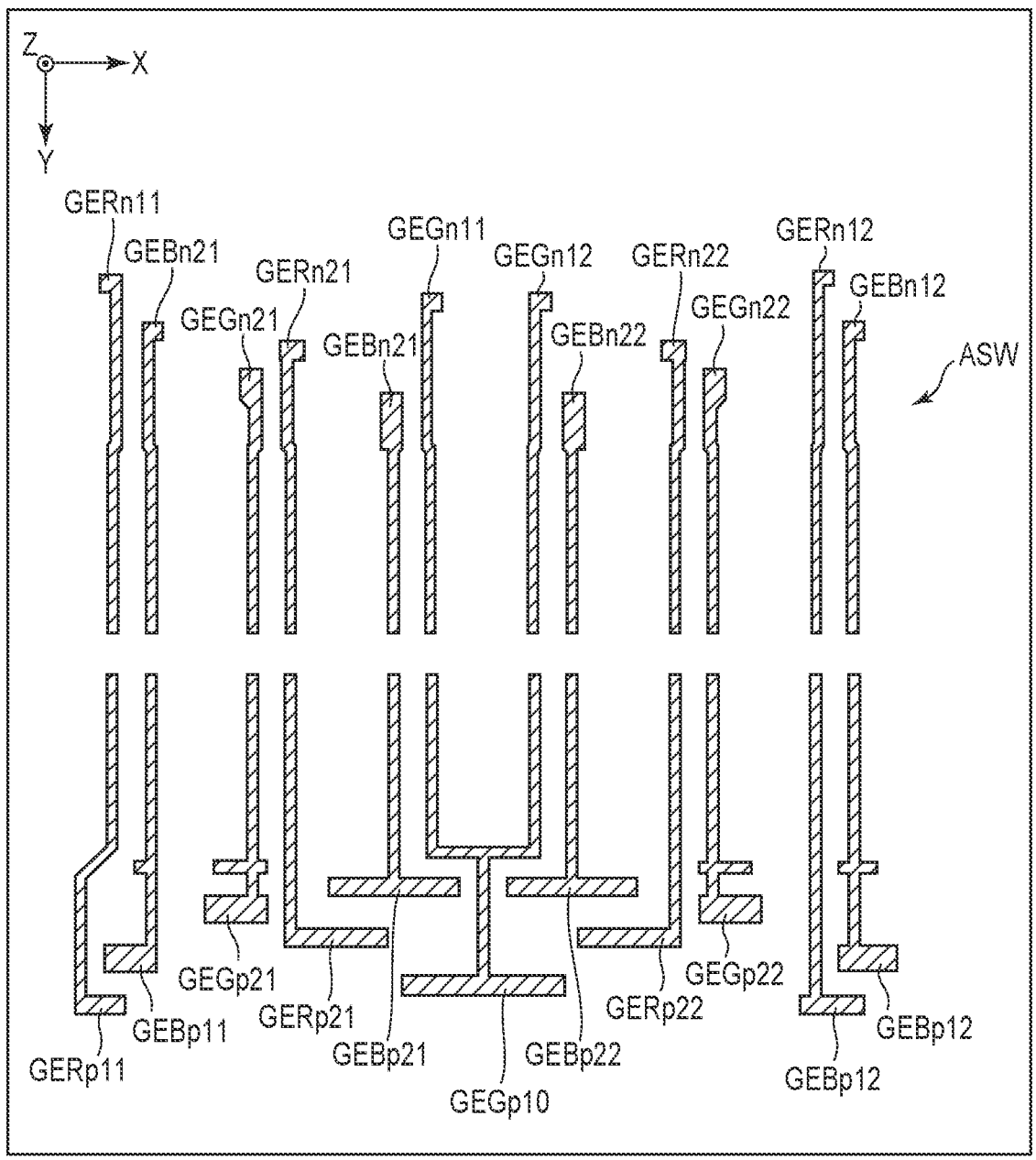
F I G. 5

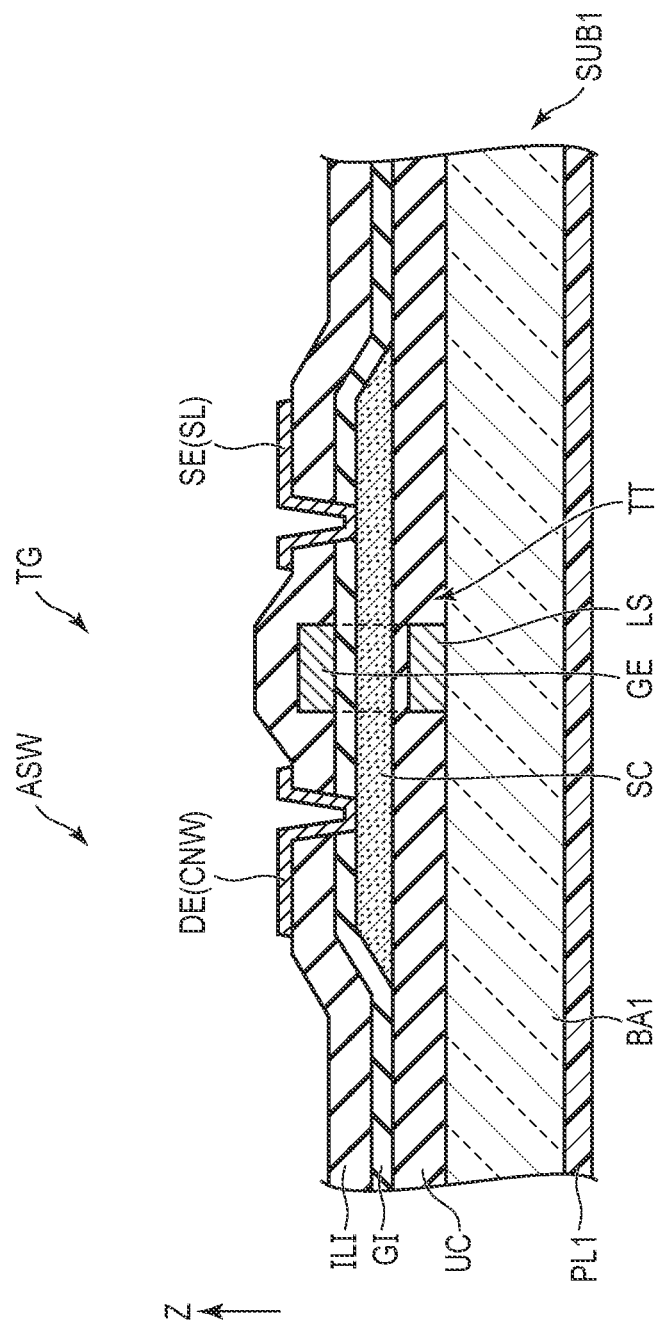
F I G. 7

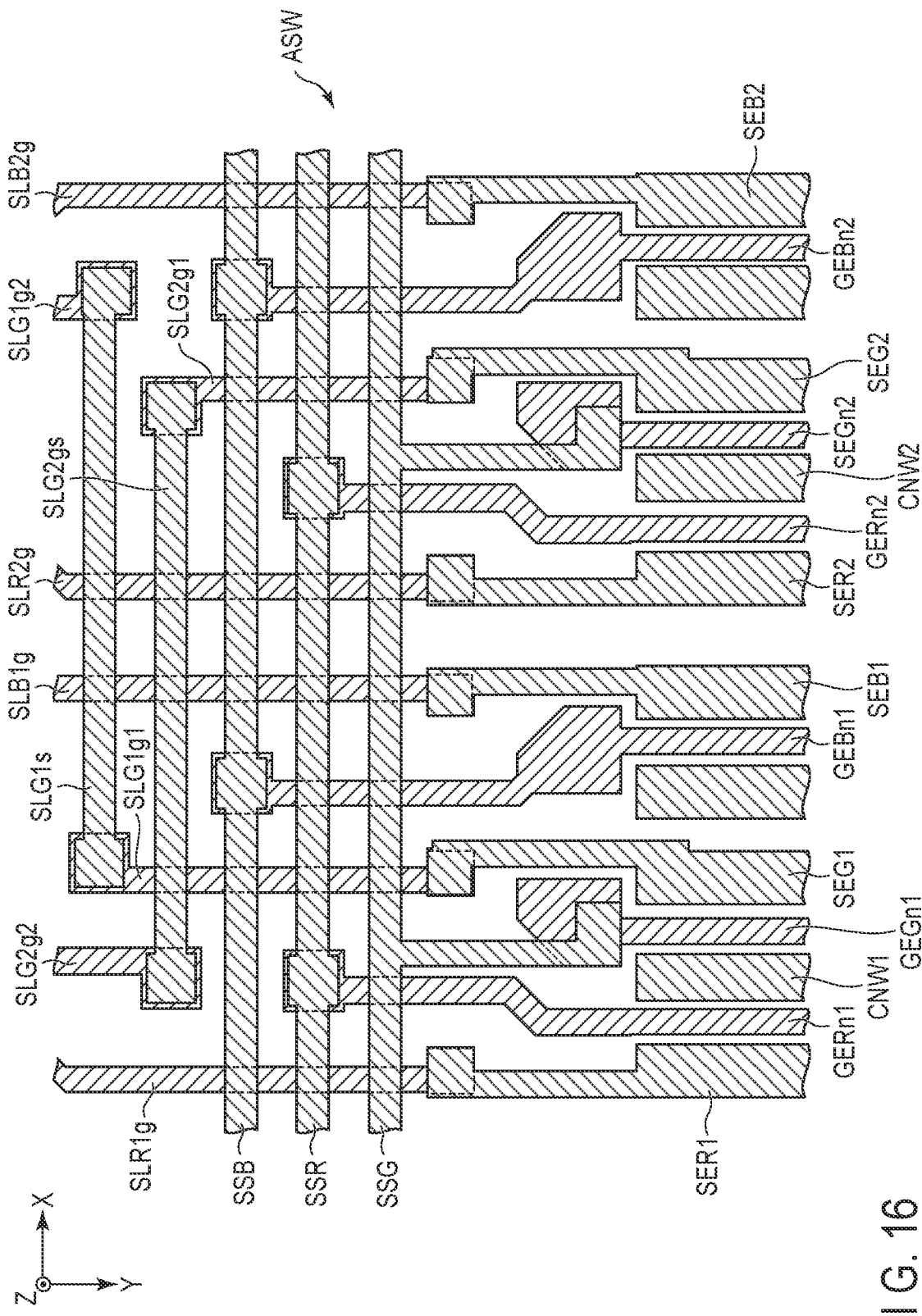
F I G. 16

DISPLAY DEVICE

CROSS-REFERENCE TO RELATED APPLICATIONS

This application is a Continuation application of PCT Application No. PCT/JP2022/007937, filed Feb. 25, 2022 and based upon and claiming the benefit of priority from Japanese Patent Application No. 2021-037461, filed Mar. 9, 2021, the entire contents of all of which are incorporated herein by reference.

FIELD

Embodiments described herein relate generally to a display device.

BACKGROUND

Liquid crystal devices using a light shielding layer as a back gate have been developed.

BRIEF DESCRIPTION OF THE DRAWINGS

FIG. 5 is a plan view of a gate electrode of FIG. 4.
FIG. 7 is a cross-sectional view of a transistor.
FIG. 16 illustrates a part of FIG. 11 in an enlarged manner.

DETAILED DESCRIPTION

Figure 1:
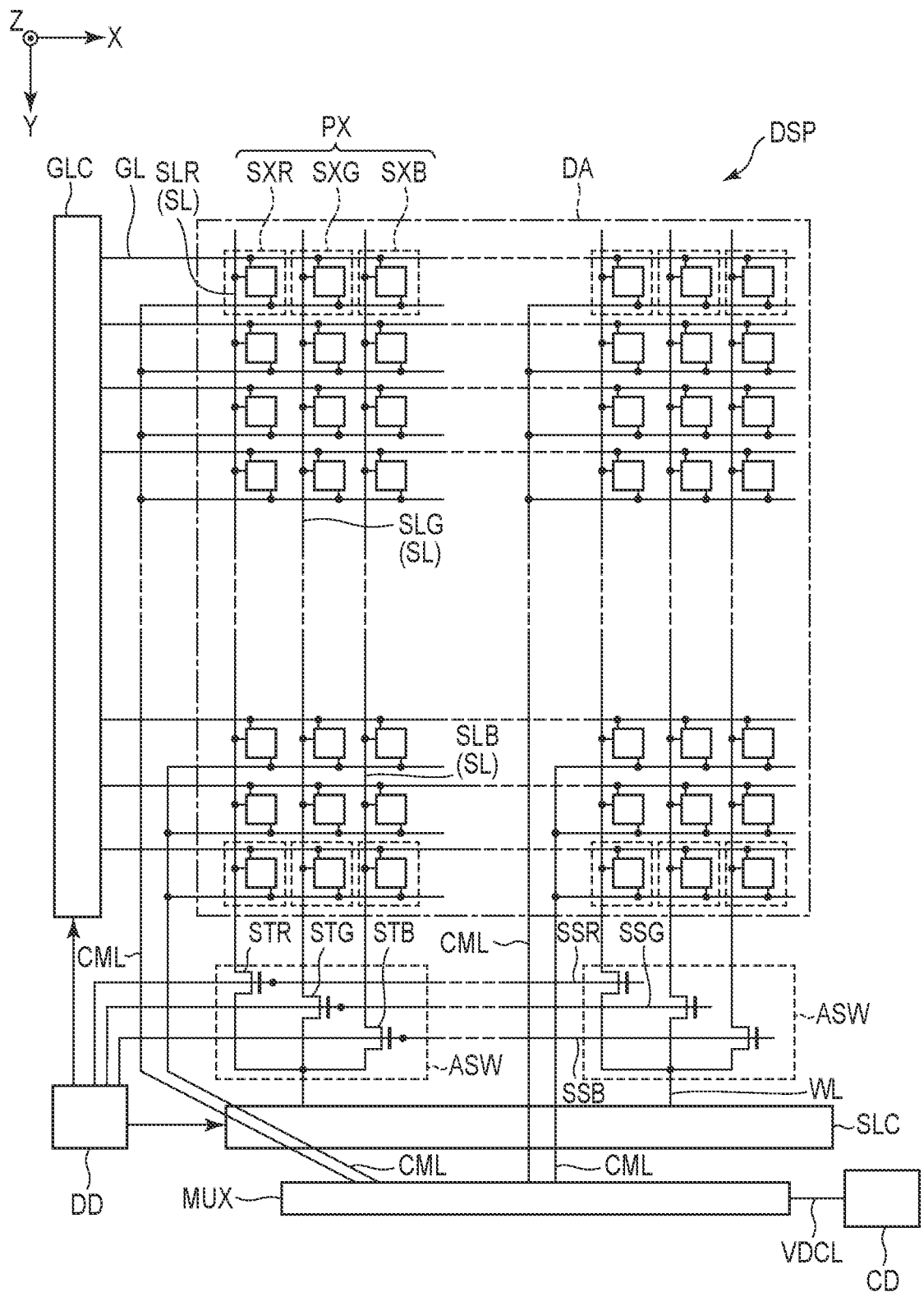
FIG. 1 is a circuit diagram of a display device.

In general, according to one embodiment, a display device comprises
a plurality of signal lines;
a switch circuit connected to the signal lines; and
a plurality of select lines extending in a first direction and arranged in a second direction, the plurality of select lines being connected to the switch circuit, wherein
the switch circuit includes a plurality of transistors connected to the plurality of the signal lines,
the plurality of transistors include a plurality of gate electrodes and a plurality of light shielding layers overlapping the plurality of gate electrodes,
each of the plurality of select lines is connected to each of the plurality of gate electrodes,
at least one of the gate electrodes includes a first linear portion extending along the second direction, and a first projection portion projecting from the first linear portion and extending along the first direction,
at least one of the first light shielding layers includes a second linear portion extending along the second direction, and a second projection portion projecting from the second linear portion and extending along the first direction,
the first linear portion overlaps the second linear portion,
the first projection portion overlaps the second projection portion, and
the first projection portion and the second projection portion overlap at least one of the plurality of select lines.

The present embodiment presents a display device which can improve characteristics of the signal line switch circuit.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

The embodiments described herein are not general ones, but rather embodiments that illustrate the same or corresponding special technical features of the invention. The following is a detailed description of one embodiment of a display device with reference to the drawings.

In this embodiment, a first direction X, a second direction Y and a third direction Z are orthogonal to each other, but may intersect at an angle other than 90 degrees. The direction toward the tip of the arrow in the third direction Z is defined as up or above, and the direction opposite to the direction toward the tip of the arrow in the third direction Z is defined as down or below.

With such expressions as "the second member above the first member" and "the second member below the first member", the second member may be in contact with the first member or may be located away from the first member. In the latter case, a third member may be interposed between the first member and the second member. On the other hand, with such expressions as "the second member on the first member" and "the second member beneath the first member", the second member is in contact with the first member.

Further, it is assumed that there is an observation position to observe the display device on a tip side of the arrow in the third direction Z. Here, viewing from this observation position toward the X-Y plane defined by the first direction X and the second direction Y is referred to as plan view. Viewing a cross-section of the display device in the X-Z plane defined by the first direction X and the third direction Z or in the Y-Z plane defined by the second direction Y and the third direction Z is referred to as cross-sectional view.

Embodiment

Figure 2A:
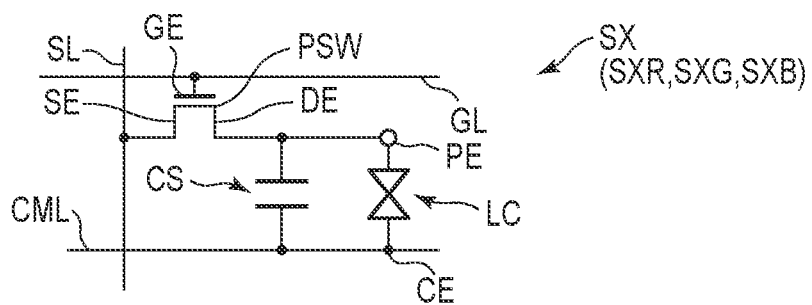
FIG. 2A is a diagram illustrating a pixel of the display device.
Figure 2B:
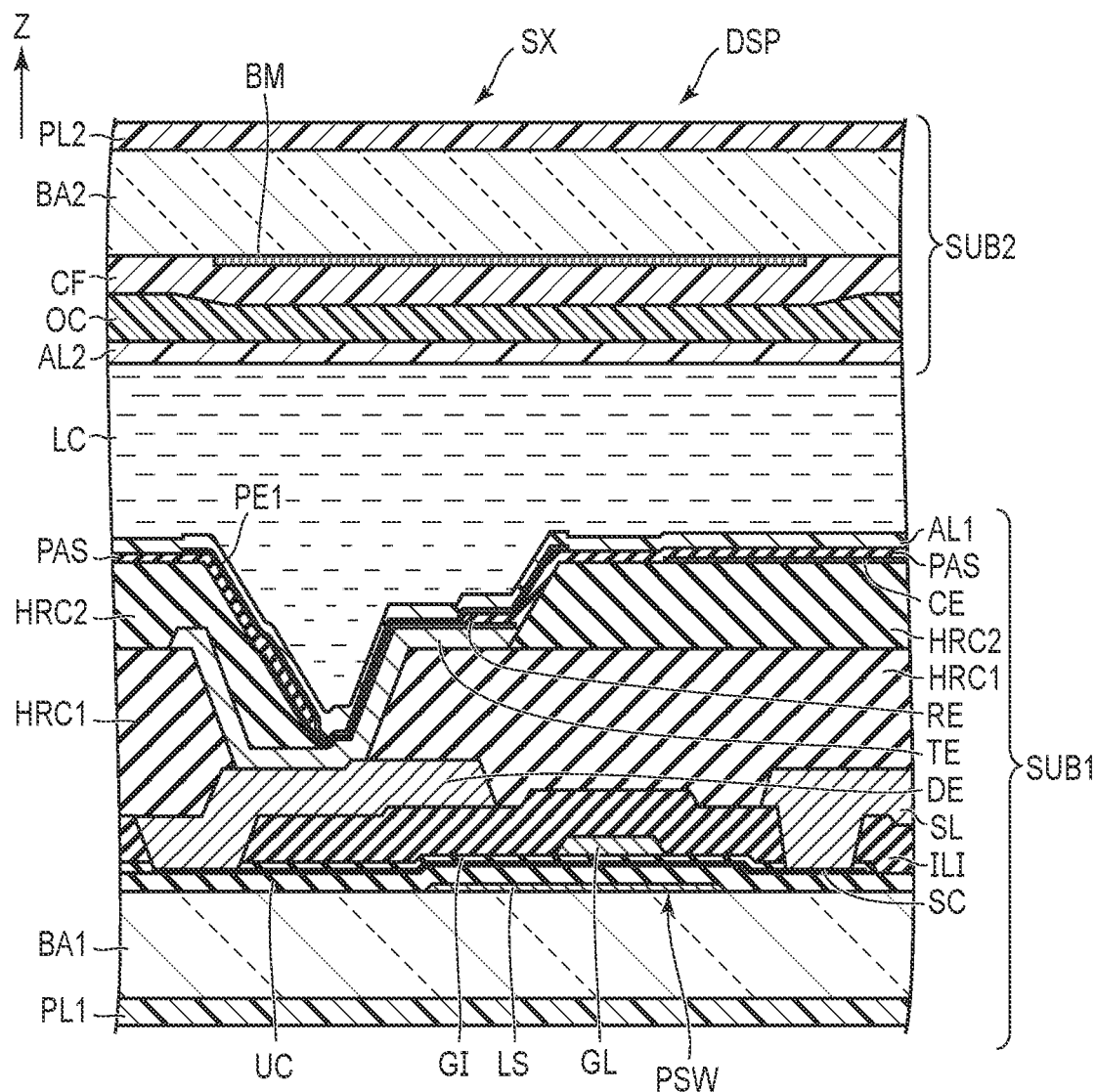
FIG. 2B is a diagram illustrating a pixel of the display device.

FIG. 1 is a circuit diagram of a display device. FIGS. 2A and 2B illustrate a pixel of the display device. FIG. 2A is a circuit diagram of a subpixel SX of FIG. 1. FIG. 2B is a cross-sectional view of a display device DSP including the subpixel SX of FIG. 1.

As in FIG. 1, a display area DA of the display device DSP includes a plurality of pixels PX. Each of the pixels PX includes subpixel SXR, subpixel SXG, and subpixel SXB displaying red (R), green (G), and blue (B), respectively. Note that, a term subpixel SX is used when it is not necessary to specifically distinguish the subpixel SXR, the subpixel SXG, and the subpixel SXB apart. As described above, each of the subpixels SX is provided with a crossing point of each scan line GL and each signal line SL. In other words, the subpixel SX is each provided with an area defined by two adjacent scan lines GL and two adjacent signal lines SL.

The scan lines GL extend in a first direction X and are arranged in a second direction Y. The signal lines SL extend in the second direction Y and are arranged in the first direction X. The subpixels SX are arranged in a matrix in the first direction X and the second direction Y.

As in FIG. 2A, each subpixel SX includes, for example, a switching element PSW, a pixel electrode PE, a common electrode CE, and a liquid crystal layer LC. The switching element SW is formed of, for example, a thin film transistor (TFT), and is electrically connected to the scan line GL and the signal line SL. The scan line GL is connected to the switching element SW in each subpixel SX arranged in the first direction X. The signal line SL is connected to a switching element PSW in each subpixel SX arranged in the second direction Y. The pixel electrode PE is electrically connected to the switching element PSW. Each of the pixel electrodes PE is opposed to the common electrode CE, and drives the liquid crystal layer LC by a field generated between the pixel electrode PE and the common electrode CE as above. Capacitance CS is formed, for example, between an electrode of same potential as the common electrode CE and an electrode of same potential as the pixel electrode PE.

A source electrode of the switching element PSW of the subpixel SX is formed integrally with the signal line SL. Furthermore, each of the signal lines SL corresponds to display data, and is connected to a signal line drive circuit SLC to which an image signal supplied to each subpixel SX is input. That is, the signal lines SL connect the subpixels SX and the signal line drive circuit SLC.

Furthermore, a gate electrode GE of the subpixel SX is formed integrally with the scan line GL. Furthermore, each scan line GL is connected to a scan line drive circuit GLC which supplies a scan signal to be supplied to each subpixel SX in a one horizontal scanning time.

Now, referring to FIG. 1, a connection relationship between the signal line SL and a signal line switch circuit ASW. In the example of FIG. 1, a signal lines SLR, a signal line SLG, and a signal line SLB are disposed as a signal line SL to be connected to each of the subpixels SX. The signal lines SLR, the signal lines SLG, and the signal lines SLB are connected to the signal line switch circuit ASW. The signal line SLR is a signal line connected to the red (R) subpixel SXR. The signal line SLG is a signal line connected to the green (G) subpixel SXG. The signal line SLB is a signal line connected to the blue (B) subpixel SXB.

Specifically, the signal line SLR is connected to a subpixel column including a plurality of subpixels SXR arranged in the second direction Y. The signal line SLG is connected to a subpixel column including a plurality of subpixels SXG arranged in the second direction Y. The signal line SLB is connected to a subpixel column including a plurality of subpixels SXB arranged in the second direction Y.

The signal line switch circuit ASW is a control circuit to supply a signal related to an image to the display area DA as the pixel circuit. The signal line switch circuit ASW includes a transistor STR, transistor STG, and transistor STB as switching elements, and a select line SSR, a select line SSG, and a select line SSB. The transistor STR, the transistor STG, and the transistor STB are each a thin film transistor, for example. When it is not necessary that the transistor STR, the transistor STG, and the transistor STB are specifically distinguished, it is referred to as a transistor ST. Furthermore, the signal line switch circuit ASW may be referred to as switch circuit.

The transistor STR is connected to the signal line SLR. The transistor STG is connected to the signal line SLG. The transistor STB is connected to the signal line SLB.

A drive element DD of FIG. 1 controls the signal line drive circuit SLC, scan line drive circuit GLC, and signal line switch circuit ASW based on display controls signals such as display data, clock signal, display timing signal transmitted from the outside of the display device.

The transistor STR, the transistor STG, and the transistor STB are each turned on/off by a switching signal output from the drive element DD through the select line SSR, the select line SSG, and the select line SSB. The transistor STR is turned on/off by a switching signal input through the select line SSR. The transistor STG is turned on/off by switching signal input through the select line SSG. The transistor STB is turned on/off by a switching signal input through the select line SSB.

The drive element DD controls turning on/off of the transistor STR, the transistor STG, and the transistor STB of the signal line switch circuit ASW according to the controlling of output of red image signal, green image signal, and blue image signal by the signal line drive circuit SLC in one horizontal period in a time divisional manner. That is, the transistors ST (the transistor STR, the transistor STG, and the transistor STB) included in the signal line switch circuit ASW are in a relationship to be driven in a time divisional manner. Specifically, an image signal from the signal line drive circuit SLC is input to a signal line SL connected to a transistor ST in an on-state through a extracting line WL amongst the transistor STR, the transistor STG, and the transistor STB. Furthermore, the drive element DD controls the scan line drive circuit GLC to maintain the on-state of the switching element PSW of a subpixel SX to which the image signal is written in a period of outputting image signals of respective colors.

Note that, the signal line switch circuit ASW may be referred to as RGB switch, time division switch, analogue switch, or selector. Furthermore, in the present embodiment, one signal line switch circuit is disposed for three signal lines connected to red, green, and blue subpixels; however, in some structure, one signal line switch circuit may be disposed for two signal lines connected to two subpixels. Or, one signal line switch circuit may be disposed for six signal lines connected to two pixels, that is, six subpixels. In that case, a signal line drive circuit outputs an image signal in one horizontal period for six times. The number of time division can be optionally set based on, for example, write condition of the image signal to each subpixel or processing power of the signal line drive circuit.

Note that, in a display period including the aforementioned horizontal period, a constant direct current voltage is supplied from a common electrode drive circuit CD to a switch circuit MUX through a line VDCL. The switch circuit MUX supplies the constant direct current voltage to all common electrodes CE through a common line CML. Thus, as described above, a field to drive the liquid crystal layer LC is generated between the pixel electrode PE and the common electrode CE.

Now, referring to FIG. 2B, a cross-sectional structure of the display device DSP including the subpixel SX will be explained. A first substrate SUB1 includes a base BA1, a light shielding layer LS, an insulating layer UC, a scan line GL, a signal line SL, a switching element PSW, an insulating layer HRCT, insulating layer HRC2, a common electrode CE, an insulating layer PAS, a pixel electrode PE, and an alignment film AL1. The switching element PSW includes a semiconductor layer SC, an insulating layer GI, a gate electrode GE formed integrally with the scan line GL, an insulating layer ILI, and a source electrode SE and a drain electrode DE formed integrally with the signal line SL, which are layered in the order stated above.

The base BA1 is a light transmissive substrate such as glass or flexible resin substrate. The insulating layer UC is positioned above the base BA1. The insulating layer GI is positioned above the insulating layer UC. The insulating layer ILI is positioned above the insulating layer GI.

The light shielding layer LS is formed between the base BA1 and the insulating layer UC. The light shielding layer LS overlaps the scan line GL (gate electrode) with the semiconductor layer SC interposed therebetween. An edge portion of the light shielding layer LS substantially matches and an edge portion of the semiconductor layer SC. Thus, light emitted from the bottom side of the semiconductor layer SC can be blocked, and light leakage of the switching element PSW can be prevented.

The insulating layer UC covers the light shielding layer LS. The semiconductor layer SC is opposed to the light shielding layer LS with the insulating layer UC interposed therebetween.

The insulating layer UC, the insulating layer GI, the insulating layer ILI, and the insulating layer PAS are inorganic insulating layers formed of an inorganic insulating material such as silicon oxide, silicon nitride, or silicon oxynitride. The insulating layer UC, the insulating layer GI, and the insulating layer ILI may have a monolayer structure using the inorganic insulating material, or may have a multilayer structure including the inorganic insulating material multi-layered therein.

On the other hand, the insulating layer HRC1 and the insulating layer HRC2 are organic insulating layers formed of an organic insulating material such as acrylic resin.

The semiconductor layer SC is disposed on the insulating layer UC. The semiconductor layer SC is formed of, for example, polycrystalline silicon. However, the semiconductor layer SC of the present embodiment is not limited thereto. The semiconductor layer SC may be formed of amorphous silicon or oxide semiconductor.

The scan line GL (gate electrode GE) is disposed on the semiconductor layer SC and the insulating layer GI. The scan line GL is formed of a metal material such as aluminum (Al), titanium (Ti), silver (Ag), molybdenum (Mo), tungsten (W), copper (Cu), and chrome (Cr), or an alloy of a combination of aforementioned metal materials, and may have a monolayer structure or a multiplayer structure. In this example, the scan line GL is formed of a molybdenum-tungsten alloy.

The light shielding layer LS is formed of a light shielding metal material. Specifically, the material used for the scan line GL is suitable, or a metal material which is different from those for the scan line GL may be adopted.

The signal line SL (source electrode SE) and the drain electrode DE are positioned above the insulating layer ILI. The signal line SL is connected to the semiconductor layer SC through contact holes of the insulating layers GI and ILI. The drain electrode DE is connected to the semiconductor layer SC through contact holes of the insulating layers GI and ILI. The signal line SL (source electrode SE) and the drain electrode DE are formed of a metal material such as aluminum (Al), titanium (Ti), silver (Ag), molybdenum (Mo), tungsten (W), copper (Cu), and chrome (Cr), or an alloy of a combination of aforementioned metal materials, and may have a single layer structure or a multilayer structure. In this example, the signal line SL (source electrode SE) and the drain electrode DE have a multilayered body including a first layer including titanium (Ti), a second layer including aluminum (Al), and a third layer including titanium (Ti) layered in this order.

The insulating layer HRC1 covers the signal line SL, the drain electrode DE, and the insulating layer ILI. An extracting electrode TE is disposed on the insulating layer HRC1, and is connected to the drain electrode DE through a contact hole of the insulating layer HRC1.

The extracting electrode TE is formed of the aforementioned metal material or an alloy of a combination of the aforementioned metal materials, and may have a single layer structure or a multilayer structure. In this example, the extracting electrode TE has a multilayered body including a first layer including titanium (Ti), a second layer including aluminum (Al), and a third layer including titanium (Ti) layered in this order, or a multilayered body including a first layer with molybdenum (Mo), second layer with aluminum (Al), and third layer with molybdenum (Mo) layered in this order. The extracting electrode TE is formed in the same line layer as with the common line CML.

The insulating layer HRC2 is disposed to cover the insulating layer HRC1 and the extracting electrode TE.

The common electrode CE and the relay electrode RE are positioned above the insulating layer HRC2. The relay electrode RE contacts the extracting electrode TE in a position overlapping therewith through a contact hole of the insulating layer HRC1. The common electrode CE and the relay electrode RE are transparent electrodes formed of a transparent conductive material such as indium tin oxide (ITO) or indium zinc oxide (IZO).

The insulating layer PAS overs the common electrode CE and the relay electrode RE.

The pixel electrode PE is positioned above the insulating layer PAS and is connected to the relay electrode RE through a contact hole of the insulating layer PAS. The pixel electrode PE is covered with the alignment film AL1. That is, the pixel electrode PE is disposed between the insulating layer PAS and the alignment film AL1. The pixel electrode PE is a transparent electrode formed of the aforementioned transparent conductive material as with the common electrode CE.

The alignment film AL1 further covers the insulating layer PAS.

A second substrate SUB2 includes a base BA2, a light shielding layer BM, a color filer CF, an overcoat layer OC, and an alignment film AL2.

The base BA2 is a light transmissive substrate such as a glass or resin substrate as with the base BA1. The light shielding layer BM and the color filter CF are positioned in the base BA2 in the side opposed to the first substrate SUB1.

The color filter CF includes a red color filter CFR, a green floor filter CFG, and a blue color filter CFB.

The overcoat layer OC covers the color filter CF. The overcoat layer OC is formed of a transparent resin.

The alignment film AL2 covers the overcoat layer OC. The alignment film AL1 and the alignment film AL2 are formed of a material with horizontal alignment characteristics.

The first substrate SUB1 and the second substrate SUB2 are arranged such that the alignment film AL1 and the alignment film AL2 are opposed to each other. The first substrate SUB1 and the second substrate SUB2 are adhered by sealing while a certain cell gap is formed therebetween. The liquid crystal layer LC is maintained between the alignment film AL1 and the alignment film AL2. The liquid crystal layer LC is formed of a positive (positive dielectric anisotropy) liquid crystal material or a negative (negative dielectric anisotropy) liquid crystal material.

A polarizer PL1 is adhered to the base BA1. A polarizer PL2 is adhered to the base BA2. Note that, a retardation plate, diffusion layer, and reflection blocking layer may be included in addition to the polarizer PL1 and the polarizer PL2.

Furthermore, the display device DSP includes an illumination device below the first substrate SUB1 which is not shown.

Figure 3:
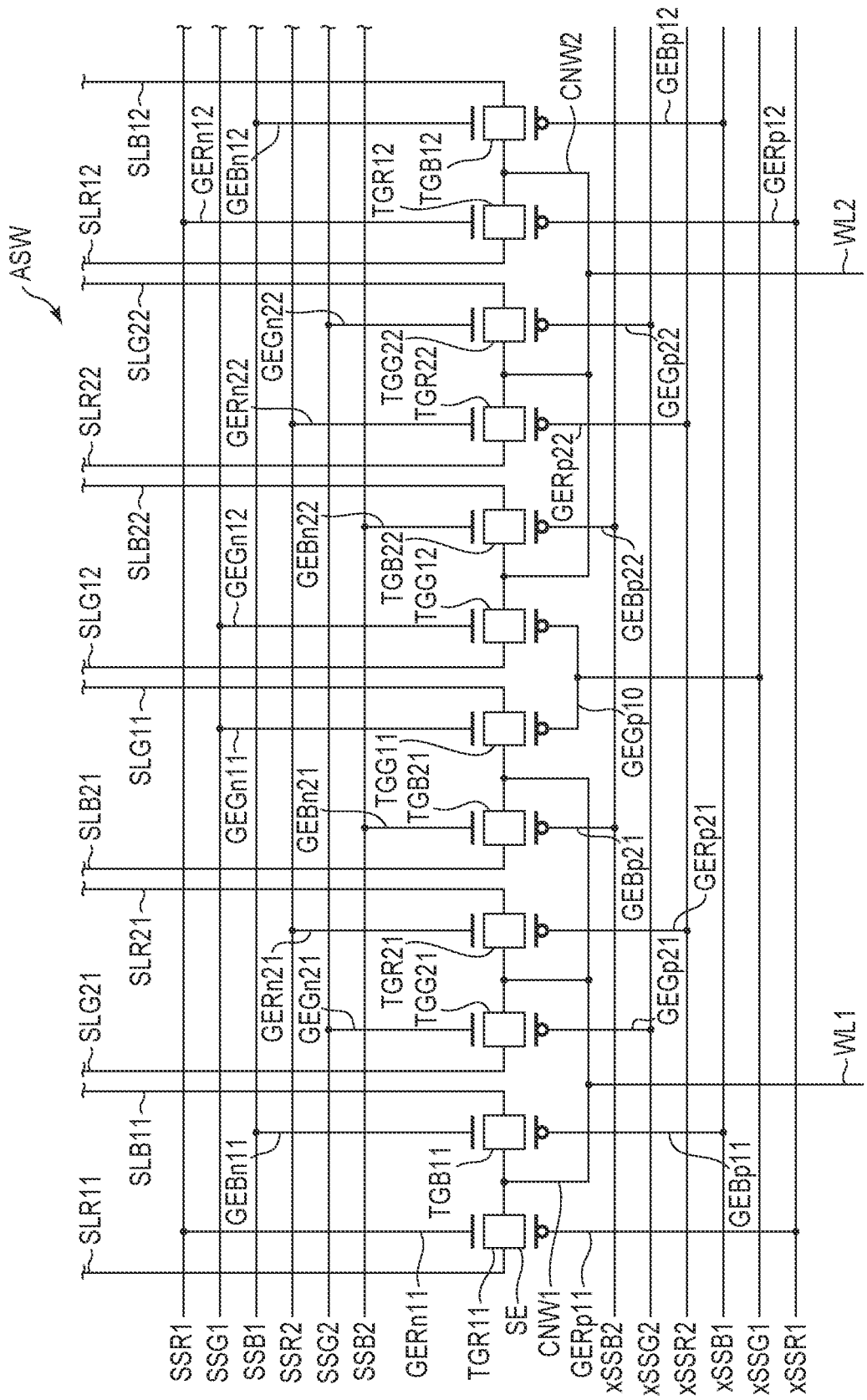
FIG. 3 is a detailed circuit diagram of a signal line switch circuit of an embodiment.

FIG. 3 is a detailed circuit diagram of the signal line switch circuit of the embodiment. The signal line switch circuit ASW of FIG. 3 includes, as the select line SSR, the select line SSG, and the selection line SSB, a select line SSR1, a select line SSG1, a select line SSB1, a select line SSR2, a select line SSG2, a select line SSB2, a select line xSSR1, a select line xSSG1, a select line xSSB1, a select line xSSR2, a select line xSSG2, and a select line xSSB2. To the select line xSSR1, the select line xSSG1, the select line xSSB1, the select line xSSR2, the select line xSSG2, and the select line xSSB2, signals of opposite polarity of the select line SSR1, the select line SSG1, the select line SSB1, the select line SSR2, the select line SSG2, and the select line SSB2. Note that, when it is not necessary to specifically distinguish the select line SSR1, the select line SSG1, the select line SSB1, the select line SSR2, the select line SSG2, the select line SSB2, the select line xSSR1, the select line xSSG1, the select line xSSB1, the select line xSSR2, the select line xSSG2, and the select line xSSB2 apart, they may be referred to as a select line SS. The select lines SS extends along the first direction X and are arranged in the second direction Y.

The signal line switch circuit ASW of FIG. 3 includes, as the transistor STR, the transistor STG, and the transistor STB, a transmission gate TGR11, a transmission gate TGG11, a transmission gate TGB11, a transmission gate TGR12, a transmission gate TGG12, a transmission gate TGB12, a transmission gate TGR21, a transmission gate TGG21, a transmission gate TGB21, a transmission gate TGR22, a transmission gate TGG22, and a transmission gate TGB22. Note that, when it is not necessary to distinguish the transmission gates apart, they will be referred to as a transmission gate TG. Transmission gates TG are each a CMOS transistor in which sources of an n-channel transistor and a p-channel transistor are connected to each other and drains thereof are connected to each other as well.

The drain of the transmission gate TGR11 is connected to a signal line SLR11 as a source of the signal line SLR11. The source of the transmission gate TGR11 is connected to a connect line CNW1. A gate electrode GERp11 as the p-channel transistor of the transmission gate TGR11 is connected to the select line xSSR1. A gate electrode GERn11 as the n-channel transistor of the transmission gate TGR11 is connected to the select line SSR1.

The drain of the transmission gate TGG11 is connected to a signal line SLG11 as a source of the signal line SLG11. The source of the transmission gate TGG11 is connected to a connect line CNW1. A gate electrode GEGp10 as the p-channel transistor of the transmission gate TGG11 is connected to the select line xSSG1. A gate electrode GEGn11 as the n-channel transistor of the transmission gate TGG11 is connected to the select line SSG1.

The drain of the transmission gate TGB11 is connected to a signal line SLB11 as a source of the signal line SLB11. The source of the transmission gate TGB11 is connected to a connect line CNW1. A gate electrode GEBp11 as the p-channel transistor of the transmission gate TGB11 is connected to the select line xSSB1. A gate electrode GEBn11 as the n-channel transistor of the transmission gate TGB11 is connected to the select line SSB1.

The drain of the transmission gate TGR21 is connected to a signal line SLR21 as a source of the signal line SLR21. The source of the transmission gate TGR21 is connected to a connect line CNW1. A gate electrode GERp21 as the p-channel transistor of the transmission gate TGR21 is connected to the select line xSSR2. A gate electrode GERn21 as the n-channel transistor of the transmission gate TGR21 is connected to the select line SSR2.

The drain of the transmission gate TGG21 is connected to a signal line SLG21 as a source of the signal line SLG21. The source of the transmission gate TGG21 is connected to a connect line CNW1. A gate electrode GEGp21 as the p-channel transistor of the transmission gate TGG21 is connected to the select line xSSG2. A gate electrode GEGn21 as the n-channel transistor of the transmission gate TGG21 is connected to the select line SSG2.

The drain of the transmission gate TGB21 is connected to a signal line SLB21 as a source of the signal line SLB21. The source of the transmission gate TGB21 is connected to a connect line CNW1. A gate electrode GEBp21 as the p-channel transistor of the transmission gate TGB21 is connected to the select line xSSB2. A gate electrode GEBn21 as the n-channel transistor of the transmission gate TGB21 is connected to the select line SSB2.

The drain of the transmission gate TGR12 is connected to a signal line SLR12 as a source of the signal line SLR12. The source of the transmission gate TGR12 is connected to a connect line CNW2. A gate electrode GERp12 as the p-channel transistor of the transmission gate TGR12 is connected to the select line xSSR1. A gate electrode GERn12 as the n-channel transistor of the transmission gate TGR12 is connected to the select line SSR1.

The drain of the transmission gate TGG12 is connected to a signal line SLG12 as a source of the signal line SLG12. The source of the transmission gate TGG12 is connected to a connect line CNW2. A gate electrode GEGp10 as the p-channel transistor of the transmission gate TGG12 is connected to the select line xSSG1. A gate electrode GEGn12 as the n-channel transistor of the transmission gate TGG12 is connected to the select line SSG1.

The drain of the transmission gate TGB12 is connected to a signal line SLB12 as a source of the signal line SLB12. The source of the transmission gate TGB12 is connected to a connect line CNW2. A gate electrode GEBp12 as the p-channel transistor of the transmission gate TGB12 is connected to the select line xSSB1. A gate electrode GEBn12 as the n-channel transistor of the transmission gate TGB12 is connected to the select line SSB1.

The drain of the transmission gate TGR22 is connected to a signal line SLR22 as a source of the signal line SLR22. The source of the transmission gate TGR22 is connected to a connect line CNW2. A gate electrode GERp22 as the p-channel transistor of the transmission gate TGR22 is connected to the select line xSSR2. A gate electrode GERn22 as the n-channel transistor of the transmission gate TGR22 is connected to the select line SSR2.

The drain of the transmission gate TGG22 is connected to a signal line SLG22 as a source of the signal line SLG22. The source of the transmission gate TGG22 is connected to a connect line CNW2. A gate electrode GEGp22 as the p-channel transistor of the transmission gate TGG22 is connected to the select line xSSG2. A gate electrode GEGn22 as the n-channel transistor of the transmission gate TGG22 is connected to the select line SSG2.

The drain of the transmission gate TGB22 is connected to a signal line SLB22 as a source of the signal line SLB22. The source of the transmission gate TGB22 is connected to a connect line CNW2. A gate electrode GEBp22 as the p-channel transistor of the transmission gate TGB22 is connected to the select line xSSB2. A gate electrode GEBn22 as the n-channel transistor of the transmission gate TGB22 is connected to the select line SSB2.

A connect line CNW1 is connected to an extracting line WL1. A connect line CNW2 is connected to an extracting line WL2. Note that, when it is not necessary to specifically distinguish between the connect line CNW1 and the connect line CNW2, they will be referred to as a connect line CNW. Furthermore, when it is not necessary to specifically distinguish between the extracting line WL1 and the extracting line WL2, they will be referred to as an extracting line WL. Furthermore, in FIG. 3, when it is not necessary to specifically distinguish the gate electrodes apart, they will be referred to as a gate electrode GE.

In the signal line switch circuit ASW of FIG. 3, six transmission gates are electrically connected with respect to one extracting line WL. That is, image signals are input to six signal lines SL through one extracting line WL.

Figure 4:
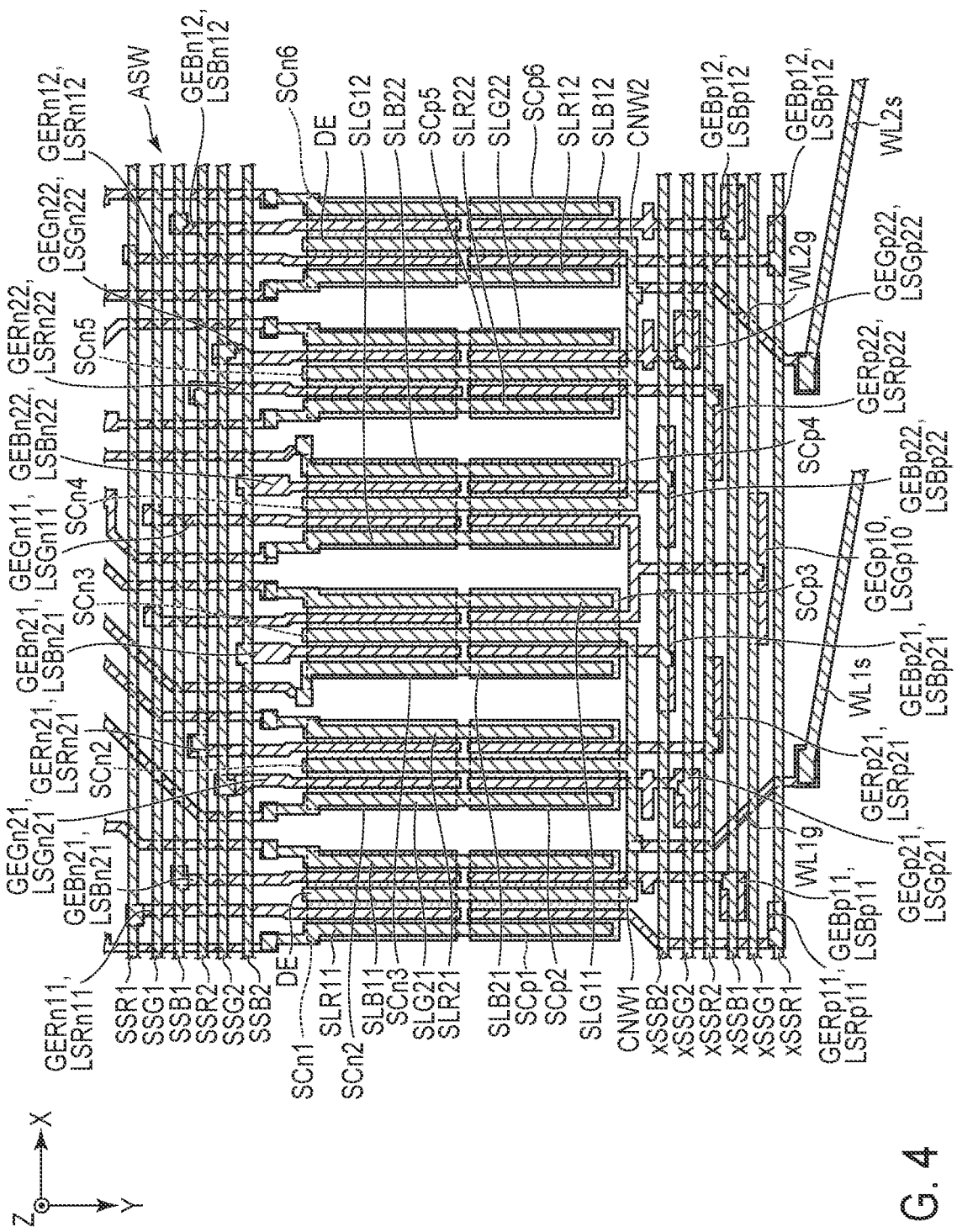
FIG. 4 is a plan view of the signal line switch circuit.

FIG. 4 is a plan view of the signal line switch circuit. In the signal line switch circuit ASW of FIGS. 3 and 4, the n-channel transistor of each of the transmission gates TGR11 and TGB11 is formed using a semiconductor layer SCn1. The n-channel transistor of each of the transmission gate TGG21 and the transmission gate TGR21 is formed using a semiconductor layer SCn2. The n-channel transistor of each of the transmission gates TGB21 and TGG11 is formed using a semiconductor layer SCn3.

The n-channel transistor of each of the transmission gates TGG12 and TGB22 is formed using a semiconductor layer SCn4. The n-channel transistor of each of the transmission gate TGR22 and the transmission gate TGG22 is formed using a semiconductor layer SCn5. The n-channel transistor of each of the transmission gate TGR12 and the transmission gate TGB12 is formed using a semiconductor layer SCn6.

The p-channel transistor of each of the transmission gate TGR11 and the transmission gate TGB11 is formed using a semiconductor layer SCp1. The p-channel transistor of each of the transmission gate TGG21 and the transmission gate TGR21 is formed using a semiconductor layer SCp2. The p-channel transistor of each of the transmission gate TGB21 and the transmission gate TGG11 is formed using a semiconductor layer SCp3.

The p-channel transistor of each of the transmission gate TGG12 and the transmission gate TGB22 is formed using a semiconductor layer SCp4. The p-channel transistor of each of the transmission gate TGR22 and the transmission gate TGG22 is formed using a semiconductor layer SCp5. The p-channel transistor of each of the transmission gate TGR12 and the transmission gate TGB12 is formed using a semiconductor layer SCp6.

Figure 6:
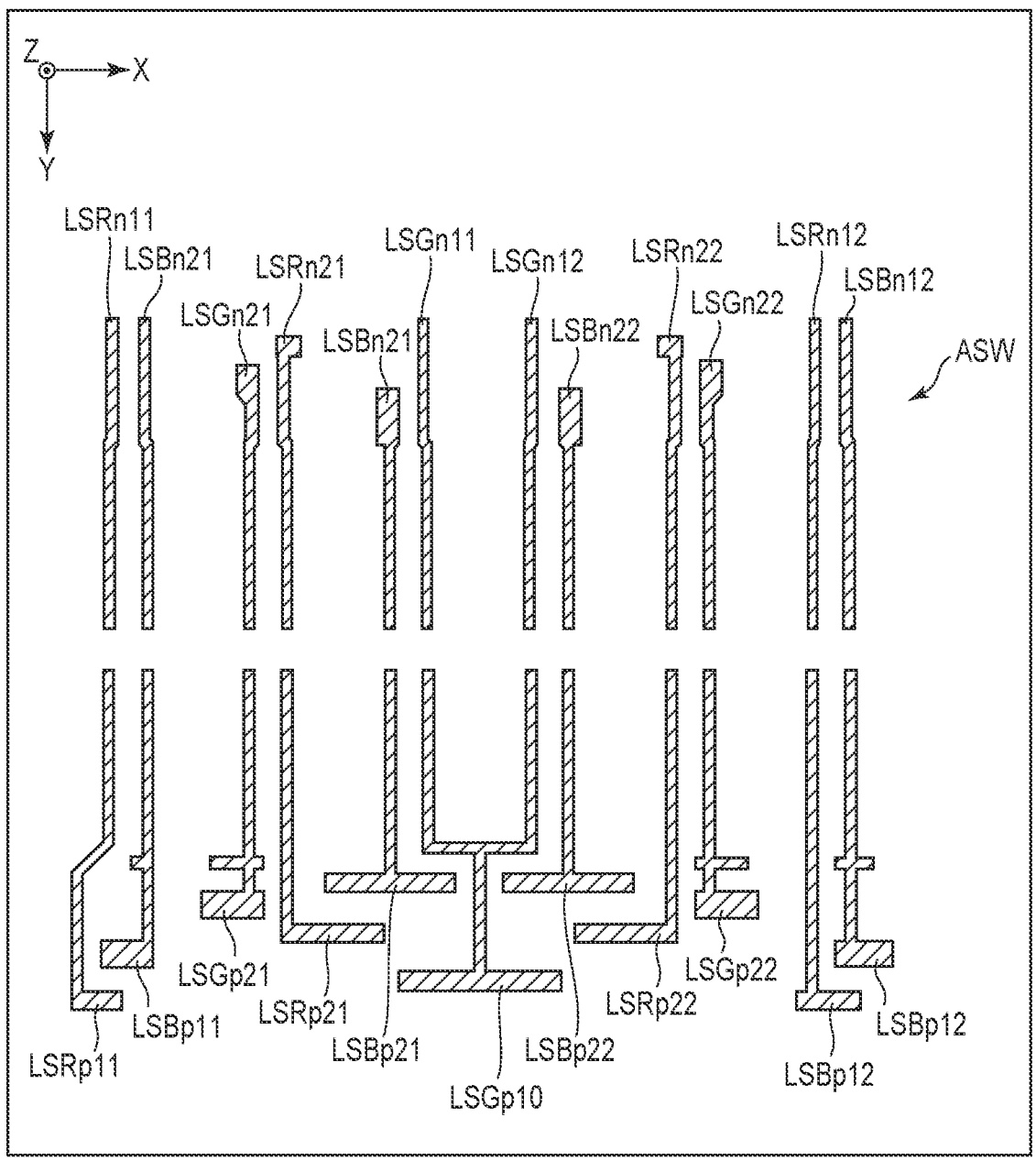
FIG. 6 is a plan view of a light shielding layer.

In the signal line switch circuit ASW of FIG. 4, the light shielding layer LS is disposed to overlap each gate electrode GE. The light shielding layer LS has a shape similar to the corresponding gate electrode GE. FIG. 5 is a plan view of the gate electrode and the light shielding layer of FIG. 4. FIG. 5 is a plan view of the gate electrode GE, and the gate electrode GE of the signal line switch circuit ASW of FIG. 5 is in the same line layer as with the gate electrode GE of FIG. 2B. FIG. 6 is a plan view of the light shielding layer LS, and the light shielding layer LS of the signal line switch circuit ASW is in the same line layer as with the light shielding layer LS of FIG. 2B. The light shielding layer LS of FIG. 6 each corresponds to the gate electrode GE of FIG. 5. For example, a light shielding layer LSGp21 of FIG. 6 corresponds to a gate electrode GEGp21 of FIG. 5. The light shielding layer LSGp21 has a shape similar to the gate electrode GEGp21, and they overlap with each other in a plan view. Note that, other light shielding layers LS and gate electrodes GE have a similar shape, and they overlap with each other in a plan view.

When the gate electrode GE and the overlapping light shielding layer LS are shaped in a similar manner, capacitance of the gate electrode GE and capacitance of the light shielding layer LS become the same. Thus, characteristics of the transmission gate and transistors thereof can be improved.

Furthermore, in the transistor (each transmission gate TG), areas of gate electrodes GE of an n-channel transistor should be the same. Furthermore, areas of gate electrodes GE of a p-channel transistor should be the same. For example, the gate electrode GERp11 of the p-channel transistor of the transmission gate TGR11 and the gate electrode GEBp11 of the p-channel transistor of the transmission gate TGB22 should be the same. If the areas of the gate electrodes GE are different, capacitances of the gate electrodes GE become different as well, and characteristics of transistors may possibly differ in each. The gate electrodes GE of the same area can even the characteristics of the transistor. The light shielding layers LS should have the same area.

In the signal line switch circuit ASW, it is suitable that the gate electrodes GE of a p-channel transistor have the same area, or the light shielding layers LS thereof have the same area. It is suitable that all of the gate electrodes GE and the light shielding layers LS of an n-channel transistor have the same area. It is suitable that the gate electrodes of an n-channel transistor have the same area, or the light shielding layers LS thereof have the same area. It is suitable that all of the gate electrodes GE and the light shielding layers LS of a p-channel transistor have the same area. Furthermore, it is more suitable that the gate electrodes and the light shielding layers LS of an n-channel transistor and the gate electrodes GE and the light shielding layers LS of a p-channel transistor have the same area.

Note that, if they are formed in two common transistors as with the gate electrode GEGp10 and the light shielding layer LSGp10, such electrode and layer should have twice the area of other gate electrodes GE and light shielding layers LS. For example, the area of the gate electrode GEGp10 is twice the area of the gate electrode GERp11. Thus, the capacitance of the gate electrode GE can be the same regardless of the transistors.

Note that, in FIG. 4, each source electrode of the transmission gate TG is illustrates as signal line SL for better understanding. A positional relationship between the source electrode SE and the signal line SL will be described later.

In FIG. 4, an extracting line WL1 includes a first portion WL1s and a second portion WL1g. A extracting line WL2 includes a first portion WL2s and a second portion WL2g. The first portion WL1s of the extracting line WL1 and the first portion WL2s of the extracting line WL2 are each formed in the same line layer as with the connect line SNW (the same line layer as with the signal line SL and the drain electrode DE of FIG. 2B). The second portion WL1g of the extracting line WL1 and the second portion WL2g of the extracting line WL2 are each formed in the same line layer as with the gate electrode GE (same line layer as with the gate electrode GE of FIG. 2B). Note that, when it is not necessary to specifically distinguish between the first portions WL1s and WL2s, they will be referred to as first portions WLs. When it is not necessary to specifically distinguish between the second portions WL1g and WL2g, they will be referred to as second portions WLg.

Select lines xSS (a select line xSSR1, a select line xSSG1, a select line xSSB1, a select line xSSR2, a select line xSSG2, and a select line xSSB2) are disposed between the connect line CNW and the first portion WLs of the extracting line WL. The connect line CNW and the first portion WLs of the extracting line WL are formed in the same line layer as described above. Thus, the connect line CNW and the first portion WLs of the extracting line WL are necessary to be bridged by a different line layer. Thus, the connect line CNW and the first portion WLs of the extracting line WL is connected by the second portion WLg in the same layer as with the gate electrode GE.

Now, the transistors of the transmission gate TG will be explained. The n-channel transistor and the p-channel transistor of the transmission gate TG are the transistors having similar cross-sectional structure. The transistor will be referred to as transistor TT. FIG. 7 is a cross-sectional view of the transistor TT.

The transistor TT of FIG. 7 has a cross-sectional structure similar to that of the switching element PSW of the subpixel SX of FIG. 2B. Note that, the light shielding layer LS of the transistor TT of FIG. 7 has a shape similar to the gate electrode GE as described above. That is, in the example of FIG. 7, an edge portion of the light shielding layer LS and an edge portion of the gate electrode GE match and conform to each other.

Furthermore, the light shielding layer LS and the gate electrode GE are not physically connected to each other. That is, the light shielding layer LS and the gate electrode GE do not contact each other. In the present embodiment, the light shielding layer LS functions as a so-called back gate, which is not physically connected to the gate electrode GE (or the scan line GL), and is driven in a floating state.

With the light shielding layer LS which is a back gate provided with the transistor TT, current flowing to the transistor T can be increased. Thus, characteristics of the transistor can be improved.

If the light shielding layer LS as a back gate is driven in a floating state, a potential applied to the light shielding layer LS can easily be controlled by changing the potential of the gate electrode GE, the drain electrode DE (the connect line CNW), and the source electrode (the signal line SL).

Furthermore, a contact structure in which a light shielding layer LS functioning as a back gate physically contacts a gate electrode GE and a select line SS is not adopted in this example, an area in which the signal line switch circuit ASW is formed can be reduced.

Figure 8:
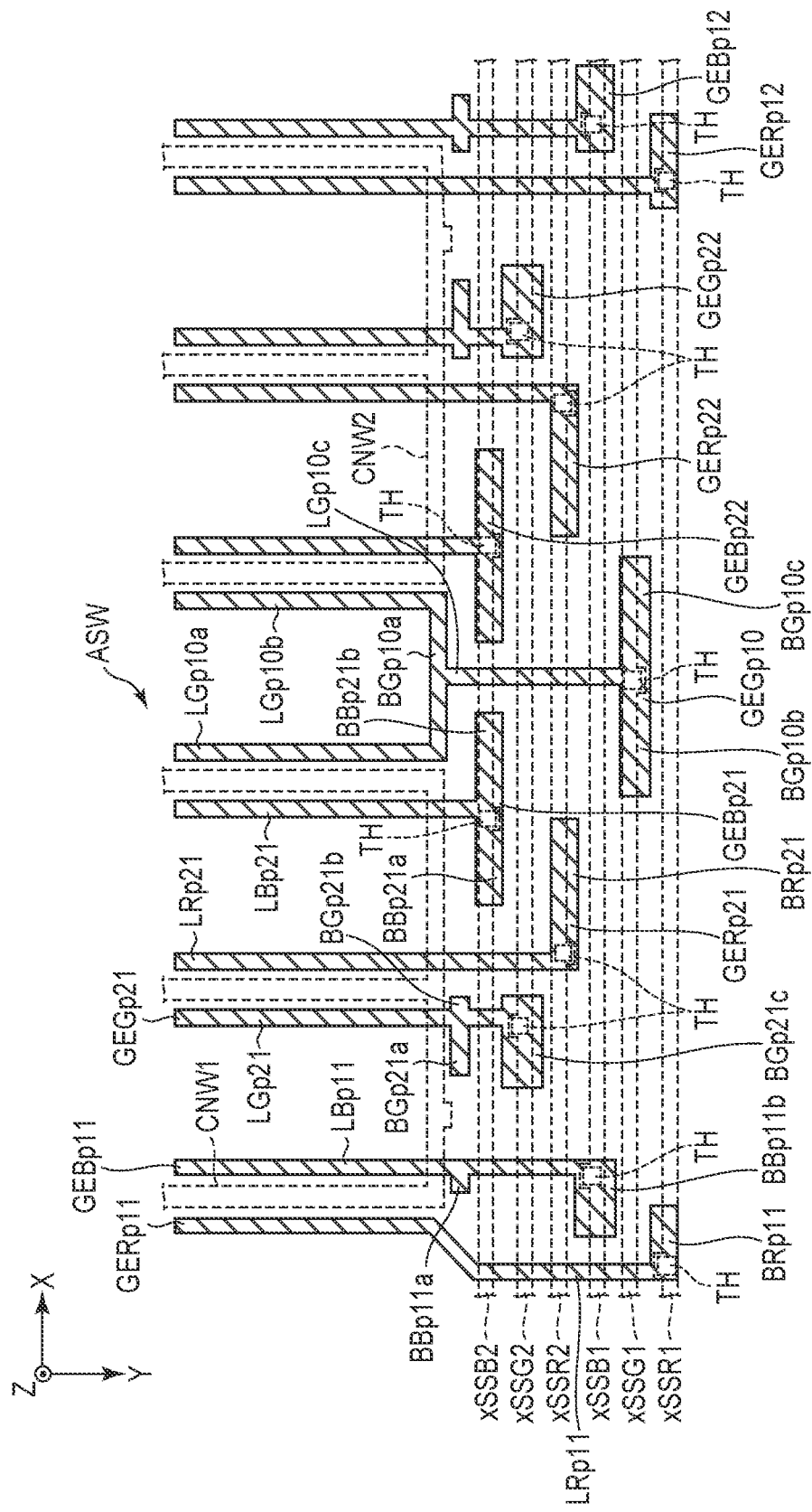
FIG. 8 is a plan view illustrating a part of FIG. 4 in an enlarged manner.

Now, referring to FIG. 4, a positional relationship between the gate electrode GE, the select line SS, and the connect line will be explained. The gate electrode GE of FIG. 4 is disposed to overlap the select line SS. Furthermore, the gate electrode GE is disposed between adjacent select lines SS. The gate electrode GE may be disposed between the select line SS and the connect line SNW adjacent to each other. FIG. 8 is a plan view illustrating a part of FIG. 4 in an enlarged manner.

FIG. 8 omits the light shielding layer LS for easier understanding. However, as explained above with reference to FIG. 4, in the signal line switch circuit ASW, provided is the light shielding layer LS of same shape as the gate electrode GE overlapping the gate electrode GE in a plan view. FIG. 8 illustrates, of the transmission gate TG of the signal line switch circuit ASW, the gate electrode GE of the p-channel transistor and the select line SS connected thereto. In FIG. 8, TH indicates a contact hole formed in the insulating layer ILI, and the gate electrode GE and the select line SS are connected together through the contact hole TH. Although this is not shown, the select line SS of an n-channel transistor and the gate electrode GE are connected together through the contact hole TH.

The gate electrode GE of FIG. 8 includes, for example, a linear portion extending along the second direction Y and a projection portion projecting from the linear portion and extending along the first direction X. Specifically, the gate electrode GERp11 includes a linear portion LRp11 and a projection portion BRp11. The linear portion LRp11 extends along the second direction Y as mentioned above. The projection portion BRp11 extends from the linear portion LRp11 along the first direction X. The projection portion BRp11 overlaps the select line xSSR1 in a plan view.

A length (width) of the projection portion BRp11 in the second direction Y may be longer than a length (width) of the linear portion LRp11 in the first direction X.

The gate electrode GEBp11 includes a linear portion LBp11 extending along the second direction Y, a projection portion BBp11a extending from the linear portion LGp11 in an opposite direction in the first direction X, and a projection portion BBp11b extending from the linear portion LGp21 in an opposite direction in the first direction X. The projection portion BBp11a is disposed between the connect line SNW1 and the select line xSSR1. The projection portion BBp11b overlaps the select line xSSB1.

A length (width) of the projection portion BBp11b in the second direction Y may be longer than a length (width) of the projection portion BBp11a in the second direction Y. A length (width) of the projection portion BBp11b in the second direction Y may be longer than a length (width) of the linear portion LBp11 in the first direction X.

The gate electrode GEGp21 includes a linear portion LGp21 extending along the second direction Y, a projection portion BGp21a extending from the linear portion LGp21a in the opposite direction of the first direction X, a projection portion BGp21b extending from the linear portion LGp21 along the first direction X, and a projection portion BGp21c extending from the tip of the linear portion LGp1 along the first direction X. The projection portion BGp21a and the projection portion BGp21b are disposed between the connect line SNW1 and the select line xSSR1. The projection portion BGp21c overlaps the select line xSSG2.

A length (width) of the projection portion BGp21c in the second direction Y may be longer than a length (width) of the projection portion BGp21a and the projection portion BGp21b in the second direction Y. A length (width) of the projection portion BGp21c in the second direction Y may be longer than a length (width) of the linear portion LGp21 in the first direction X.

The gate electrode GERp21 includes a linear portion LRp2 extending along the second direction Y and a projection portion BRp21 extending from a tip of the linear portion LRp21 along the first direction X. The projection portion BRp21 overlaps the select line xSSR2.

A length (width) of the projection portion BRp21 in the second direction Y may be longer than a length (width) of the linear portion LRp21 in the first direction X.

The gate electrode GEBp21 includes a linear portion LBp21 extending along the second direction Y, a projection portion BBp21a extending from the tip of the linear portion LBp21 in the first direction X, and a projection portion BBp21b extending from the tip of the linear portion LBp1 along the first direction X. The projection portion BBp21a and the projection portion BBp21b overlap the select line xSSB2.

A length (width) of the projection portion BBp21a and the projection portion BBp21b in the second direction Y may be longer than a length (width) of the linear portion LBp21 in the first direction X.

The gate electrode GEGp10 includes a linear portion LGp10a and a linear portion LGp10b, and a projection portion BGp10a connecting the ends of the linear portions LGp10a and LGp10b and extending parallel to the first direction X. The gate electrode GE10 includes a linear portion LGp10c extending along the second direction Y, a projection portion BGp10b extending from the tip of the linear portion LGp10c in an opposite direction of the first direction X, and a projection portion BGp10c extending from the tip of the linear portion LGp10c along the first direction X. The projection portion BGp10b and the projection portion BGp10c overlap the select line xSSG1.

A length (width) of the projection portion BGp10b and the projection portion BGp10c in the second direction Y may be longer than a length (width) of the linear portion LGp10c in the first direction X.

Although explanation is omitted, each of the gate electrode GERp22, the gate electrode GEBp22, the gate electrode GEGp22, the gate electrode GERp12, and the gate electrode GEBp12 includes linear portions and projection portions in a similar manner as above.

Furthermore, as shown in FIGS. 4 and 6, since the gate electrode GE and the light shielding layer LS are shaped similarly, the light shielding layer LSRp11, the light shielding layer LSBp11, the light shielding layer LSGp21, the light shielding layer LSRp21, the light shielding layer LSBp21, the light shielding layer LSp10, the light shielding layer LSBp22, the light shielding layer LSRp22, the light shielding layer LSGp22, the light shielding layer LSBp12, and the light shielding layer LSBp12 each have linear portions and projection portions in a similar manner as in FIG. 8.

For example, the linear portion LGp10c of the gate electrode Gp21 will be referred to as first linear portion, and the projection portion BGp10b and the projection portion BGp10c will be referred to as first projection portions. An area of the light shielding layer LSGp10 overlapping the linear portion LGp10c will be referred to as second linear portion, and an area thereof overlapping the projection portion BGp10b and the projection portion BGp10c will be referred to as a second projection portion. The first projection portion and the second projection portion overlap the select line xSSG which is at least one select line.

The projection portion BGp10a extending from the linear portion LGp10c as the first linear portion in parallel to the first direction X will be referred to as a third projection portion. The area of the light shielding layer LSGp10 overlapping the projection portion BGp10a will be referred to as a fourth projection portion. The third projection portion and the fourth projection portion are disposed between the connect electrode CNW1 (or the connect electrode CNW2) and the select line xSSB2.

Figure 9:
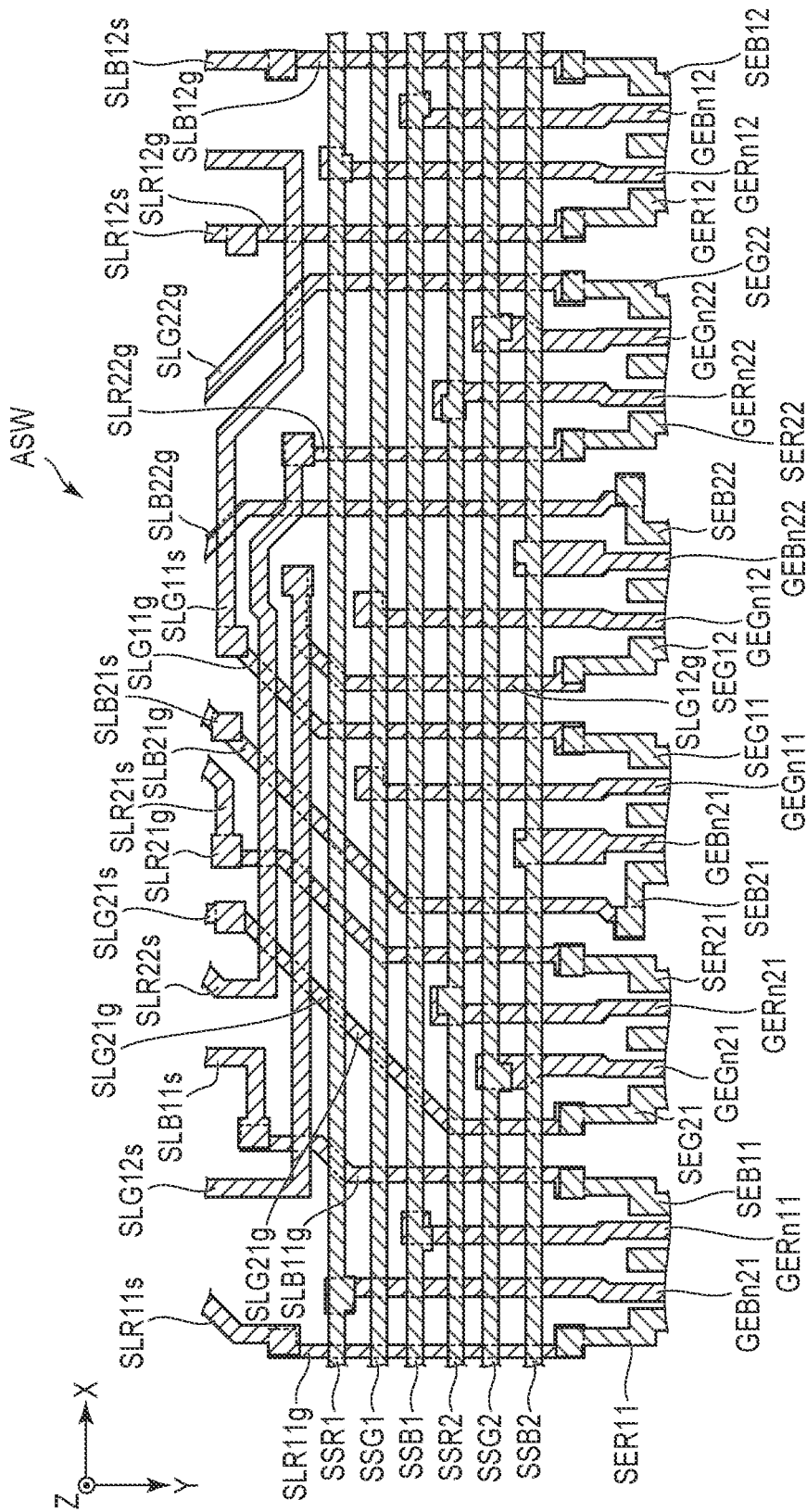
FIG. 9 is a plan view illustrating a part of FIG. 4 in an enlarged manner.

FIG. 9 is a plan view illustrating a portion of FIG. 4 in an enlarged manner. FIG. 9 illustrates a gate electrode GE of an n-channel transistor and a select line SS connected thereto of the transmission gate TG of the signal line switch circuit ASW.

Figure 10:
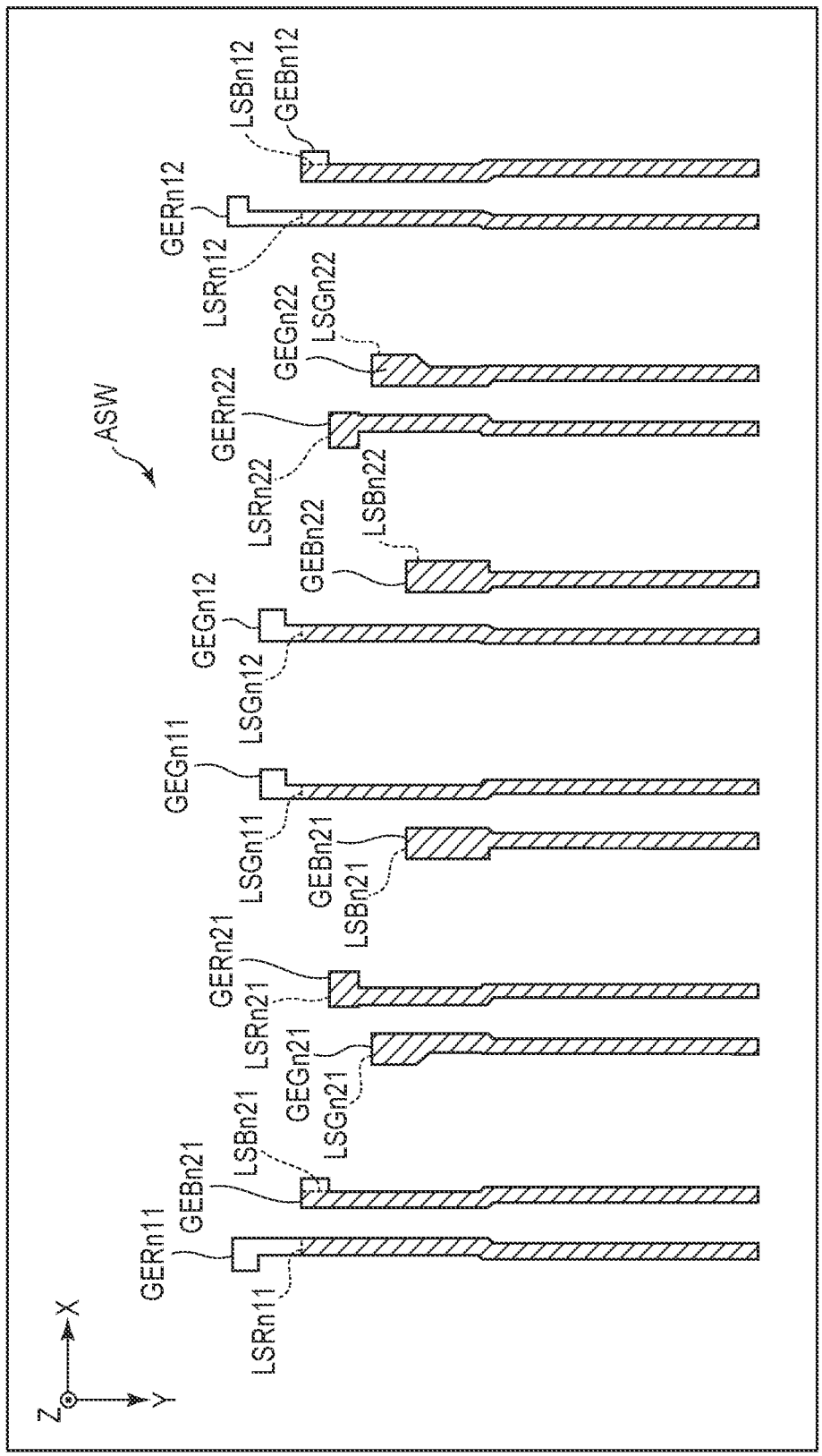
FIG. 10 is a plan view illustrating the gate electrode and the light shielding layer.

The gate electrode GE of an n-channel transistor and the light shielding layer LS of FIG. 9 have substantially the same shape. However, a portion of the gate electrode GE and the light shielding layer LS have portions shaped differently. FIG. 10 is a plan view illustrating the gate electrode and the light shielding layer. Note that, in FIG. 10, the gate electrode GE is depicted in a solid line, and the light shielding layer LS is depicted in a dotted line and is hatched.

In the signal line switch circuit ASW of FIG. 10, the gate electrode GEGn21 and the light shielding layer LSGn21 have the same shape, and the same applies to the gate electrode GERn21 and the light shielding layer LSRn21, the gate electrode GEBn21 and the light shielding layer LSBn21, the gate electrode GEBn22 and the light shielding layer LSBn22, the gate electrode GERn22 and the light shielding layer LSRn22, and the gate electrode GEGn22 and the light shielding layer LSGn22.

On the other hand, the gate electrode GERn11 and the light shielding layer LSRn11 have similar shapes but do not have a perfectly-same shape, and the same applies to the gate electrode GEBn21 and the light shielding layer LSBn21, the gate electrode GEGn11 and the light shielding layer LSGn11, the gate electrode GERn22 and the light shielding layer LSRn22, and the gate electrode GEBn12 and the light shielding layer LSBn12.

However, for example, the areas of the gate electrode GE and the light shielding layer LS are the same in the gate electrode GE and the light shielding layer LS of FIG. 10 regardless of the transistor TT. For example, even though the gate electrode GERn11 and the light shielding layer LSRn11 do not have a perfectly-same shape, but the areas of the gate electrode GERn11 and the light shielding layer LSRn11 are the same by adjusting, for example, a line width of the gate electrode GRRn11 and the light shielding layer LSRn11. Thus, the gate electrode Tn11 and the gate electrode GEGn11 have the same area, and furthermore, the light shielding layer LSRn11 and the light shielding layer LSGn11 have the same area, and the gate electrode GE and the light shielding layer LS have the same area regardless of the transistor TT.

Now, the signal line SL will be explained. The signal line SL of FIG. 9 includes a first portion SLs, a second portion SLg, and a source electrode SE. The source electrode depicted as the signal line SL in FIG. 4 is the source electrode SE of FIG. 9.

In FIG. 9, the signal line SLR11 includes a first portion SLR11s, second portion SLR11g, and source electrode SER11 which is a drain of the transmission gate TGR11. The first portion SLR11s and the source electrode SER11 are formed in the same line layer as with the select line SS, the connect line CNW, and the first portion WLs of the extracting line WL. The second portion SLR11g is formed in the same line layer as with the gate electrode GE.

The first portion SLR11s of the signal line SLR11 and the source electrode SER11 are formed in the same line layer as with the select line SS as mentioned above. Thus, in the area where the select line SS is arranged, a bridge by another line layer is required. Thus, in the area where the select line SS is arranged, the second portion SLR11g in the same layer as with the gate electrode GE connects between the first portion SLR11s of the signal line SLR11 and the source electrode SER11. The same applies to the other signal lines SL.

The signal line SLB11 includes a first portion SLB11s, a second portion SLB11g, and a source electrode SEB11. The first portion SLB11s and the source electrode SEB11 are formed in the same line layer as with the select line SS, the connect line CNW, and the first portion WLs of the extracting line WL. The second portion SLB11g is formed in the same line layer as with the gate electrode GE.

The signal line SLG21 includes a first portion SLG21s, a second portion SLG21g, and a source electrode SEG21. The first portion SLG21s and the source electrode SEG21 are formed in the same line layer as with the select line SS, the connect line CNW, and the first portion WLs of the extracting line WL. The second portion SLG21g is formed in the same line layer as with the gate electrode GE.

The signal line SLR21 includes a first portion SLR21s, a second portion SLR21g, and a source electrode SER21. The first portion SLR21s and the source electrode SER21 are formed in the same line layer as with the select line SS, the connect line CNW, and the first portion WLs of the extracting line WL. The second portion SLR21g is formed in the same line layer as with the gate electrode GE.

The signal line SLB21 includes a first portion SLB21s, a second portion SLB21g, and a source electrode SEB21. The first portion SLB21s and the source electrode SEB21 are formed in the same line layer as with the select line SS, the connect line CNW, and the first portion WLs of the extracting line WL. The second portion SLB21g is formed in the same line layer as with the gate electrode GE.

The signal line SLG11 includes a first portion SLG11s, a second portion SLG11g, and a source electrode SEG11. The first portion SLG11s and the source electrode SEG11 are formed in the same line layer as with the select line SS, the connect line CNW, and the first portion WLs of the extracting line WL. The second portion SLG11g is formed in the same line layer as with the gate electrode GE.

The signal line SLG12 includes a first portion SLG12s, a second portion SLG12g, and a source electrode SEG12. The first portion SLG12s and the source electrode SEG12 are formed in the same line layer as with the select line SS, the connect line CNW, and the first portion WLs of the extracting line WL. The second portion SLG12g is formed in the same line layer as with the gate electrode GE.

The signal line SLB22 includes a first portion which is not shown, a second portion SLB22g, and a source electrode SEB22. The first portion which is not shown and the source electrode SEB22 are formed in the same line layer as with the select line SS, the connect line CNW, and the first portion WLs of the extracting line WL. The second portion SLB22g is formed in the same line layer as with the gate electrode GE.

The signal line SLR22 includes a first portion SLR22s, a second portion SLR22g, and a source electrode SER22. The first portion SLR22s and the source electrode SER22 are formed in the same line layer as with the select line SS, the connect line CNW, and the first portion WLs of the extracting line WL. The second portion SLR22g is formed in the same line layer as with the gate electrode GE.

The signal line SLG22 includes a first portion which is not shown, a second portion SLG22g, and a source electrode SEG22. The first portion which is not shown and the source electrode SEG22 are formed in the same line layer as with the select line SS, the connect line CNW, and the first portion WLs of the extracting line WL. The second portion SLG22g is formed in the same line layer as with the gate electrode GE.

The signal line SLR12 includes a first portion SLR12s, a second portion SLR12g, and a source electrode SER12. The first portion SLR12s and the source electrode SER12 are formed in the same line layer as with the select line SS, the connect line CNW, and the first portion WLs of the extracting line WL. The second portion SLR12g is formed in the same line layer as with the gate electrode GE.

The signal line SLB12 includes a first portion SLB12s, a second portion SLB12g, and a source electrode SEB12. The first portion SLB12s and the source electrode SEB12 are formed in the same line layer as with the select line SS, the connect line CNW, and the first portion WLs of the extracting line WL. The second portion SLB12g is formed in the same line layer as with the gate electrode GE.

The shapes and arrangements of the linear portions and the projection portions of the gate electrode GE and the light shielding layer LS have been explained above; however, the present embodiment is not limited to the aforementioned example. The gate electrode GE and the light shielding layer LS should include a projection portion projecting from a linear portion. It is suitable that the projection portion is arranged in a position overlapping the select line SS, between adjacent connect line CNW and select line SS, or between adjacent select lines SS. With such arrangement of the projection portion, a capacitance of the gate electrode GE and the light shielding layer LS can be secured greatly, and thus, characteristics of the transistor can be improved.

However, as described above, in each transistor (each transmission gate TG), it is suitable that the gate electrodes GE have the same area. In a p-channel transistor, it is suitable that the gate electrodes GE or the light shielding layers have the same area. In an n-channel transistor, it is suitable that the gate electrodes GE or the light shielding layers have the same area. In each of an n-channel and a p-channel transistors, it is suitable that the gate electrodes GE or the light shielding layers have the same area.

With the gate electrodes GE and the light shielding layers LS having the same area, the capacitances of the gate electrode GE and the light shielding layer LS will be the same. Thus, characteristics of each transistor can be uniformed.

With the present embodiment, the capacitance of the gate electrode GE and the capacitance of the light shielding layer LS can be the same. By providing the linear portion and the projection portion with each of the gate electrode GE and the light shielding layer LS and using the light shielding layer LS as a back gate, current flowing to the transistor TT (transmission gate TG) can be increased. Furthermore, with the gate electrode GE and the light shielding layer LS of each transistor T having the same area, unevenness in the transistors TT can be preventable. Thus, characteristics of the signal line switch circuit ASW can be improved. Furthermore, display quality of the display device DSP can be improved.

Structural Example

Figure 11:
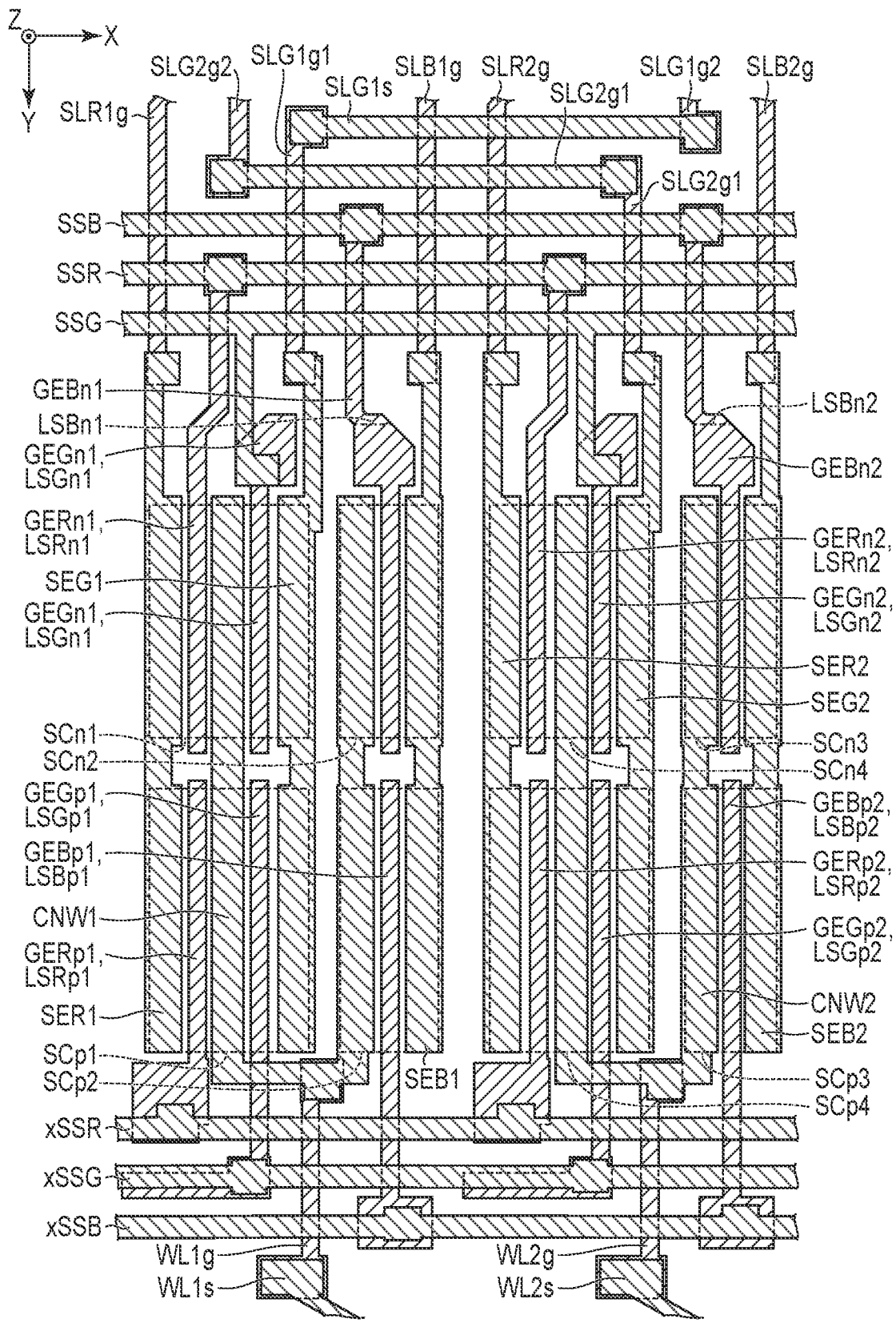
FIG. 11 is a plan view illustrating another structural example of the embodiment.

FIG. 11 is a plan view illustrating another structural example of the embodiment. In the structural example of FIG. 11, as compared to the example of FIG. 4, a different transistor is adopted in a signal line switch circuit.

A signal line switch circuit ASW of FIG. 11 includes three transmission gates electrically connected to one extracting line WL. That is, image signals are input to three signal lines SL through one extracting line WL.

Figure 12:
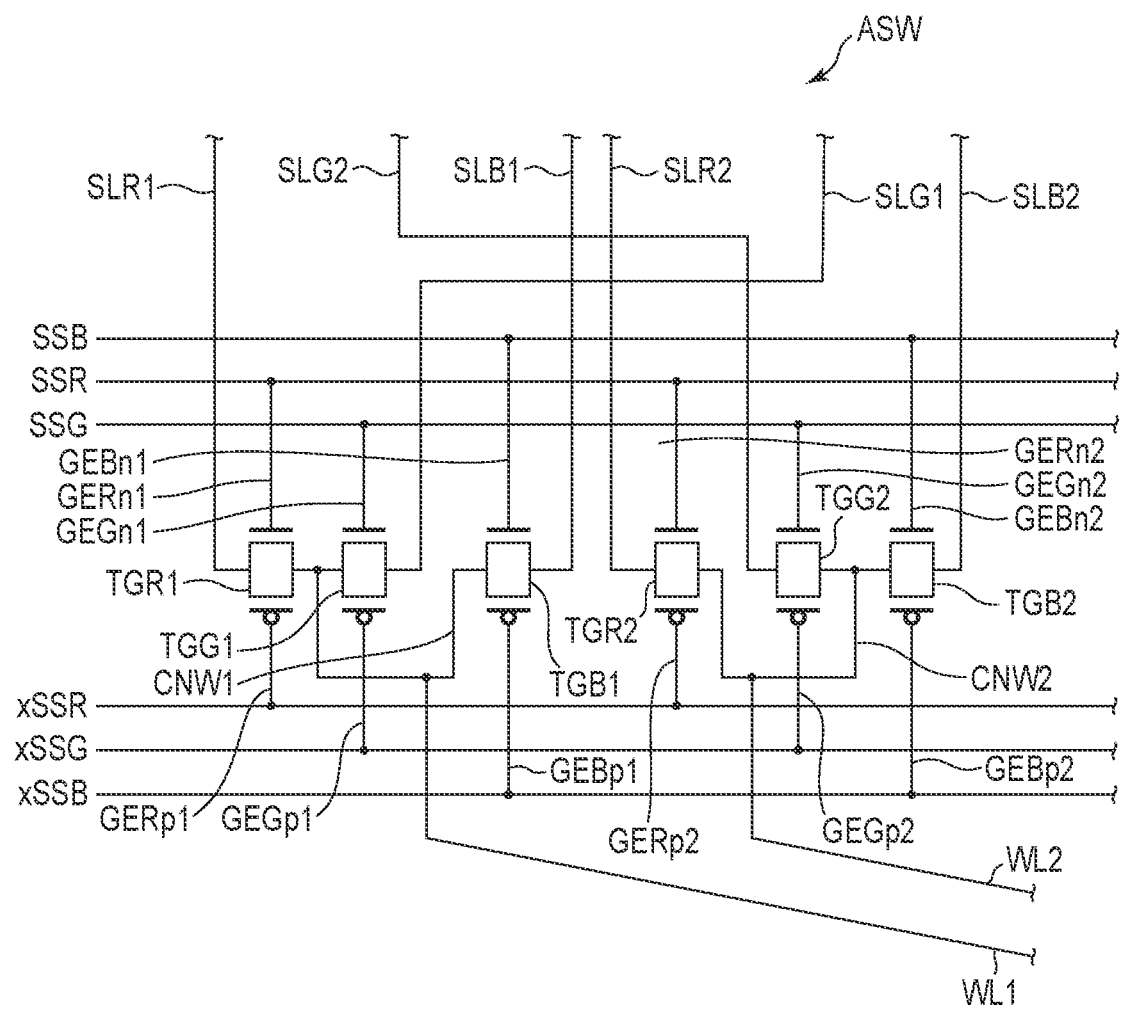
FIG. 12 is a circuit diagram of a signal line switch circuit of FIG. 11.

FIG. 12 is a circuit diagram of the signal line switch circuit of FIG. 11. In FIGS. 11 and 12, a drain of a transmission gate TGR1 is connected to a signal line SLR1 as a source of the signal line SLR1. The source of the transmission gate TGR1 is connected to a connect line CNW1. A gate electrode GERn1 of an n-channel transistor of the transmission gate TGR1 is connected to a select line SSR. A gate electrode GERp1 of a p-channel transistor of the transmission gate TGR1 is connected to a select line xSSR.

A drain of a transmission gate TGG1 is connected to a signal line SLG1 as a source of the signal line SLG1. The source of the transmission gate TGG1 is connected to the connect line CNW1. A gate electrode GEGn1 of an n-channel transistor of the transmission gate TGG1 is connected to a select line SSG. A gate electrode GEGp1 of a p-channel transistor of the transmission gate TGG1 is connected to a select line xSSG.

A drain of a transmission gate TGB1 is connected to a signal line SLB1 as a source of the signal line SLB1. The source of the transmission gate TGB1 is connected to the connect line CNW1. A gate electrode GEBn1 of an n-channel transistor of the transmission gate TGB1 is connected to a select line SSB. A gate electrode GEBp1 of a p-channel transistor of the transmission gate TGB1 is connected to a select line xSSB.

A drain of a transmission gate TGR2 is connected to a signal line SLR2 as a source of the signal line SLR2. The source of the transmission gate TGR2 is connected to a connect line CNW2. A gate electrode GERn2 of an n-channel transistor of the transmission gate TGR2 is connected to the select line SSR. A gate electrode GERp2 of a p-channel transistor of the transmission gate TGR2 is connected to the select line xSSR.

A drain of a transmission gate TGG2 is connected to a signal line SLG2 as a source of the signal line SLG2. The source of the transmission gate TGG2 is connected to the connect line CNW2. A gate electrode GEGn2 of an n-channel transistor of the transmission gate TGG2 is connected to the select line SSG. A gate electrode GEGp2 of a p-channel transistor of the transmission gate TGG2 is connected to the select line xSSG.

A drain of a transmission gate TGB2 is connected to a signal line SLB2 as a source of the signal line SLB2. The source of the transmission gate TGB2 is connected to the connect line CNW2. A gate electrode GEBn2 of an n-channel transistor of the transmission gate TGB2 is connected to the select line SSB. A gate electrode GEBp2 of a p-channel transistor of the transmission gate TGB2 is connected to the select line xSSB.

The n-channel transistor of each of the transmission gate TGR1 and the transmission gate TGG11 is formed using a semiconductor layer SCn1. The n-channel transistor of the transmission gate TGB1 is formed using a semiconductor layer SCn2. The n-channel transistor of each of the transmission gate TGR2 and the transmission gate TGG2 is formed using a semiconductor layer SCn3. The n-channel transistor of the transmission gate TGB2 is formed using a semiconductor layer SCn4.

The p-channel transistor of each of the transmission gate TGR1 and the transmission gate TGG11 is formed using a semiconductor layer SCp1. The p-channel transistor of the transmission gate TGB1 is formed using a semiconductor layer SCp2. The p-channel transistor of each of the transmission gate TGR2 and the transmission gate TGG2 is formed using a semiconductor layer SCp3. The p-channel transistor of the transmission gate TGB2 is formed using a semiconductor layer SCp4.

The signal line switch circuit ASW of FIG. 11 includes a light shielding layer LS overlapping a gate electrode GE, similar to the embodiment. In the present example, it is preferable that the gate electrode GE and the light shielding layer LS overlapping each other have the same shape.

Furthermore, it is preferable that the gate electrodes GE of the n-channel transistor have the same area. Furthermore, it is preferable that the gate electrodes GE of the p-channel transistor have the same shape. Furthermore, it is preferable that the light shielding layers LS have the same area.

Figure 13:
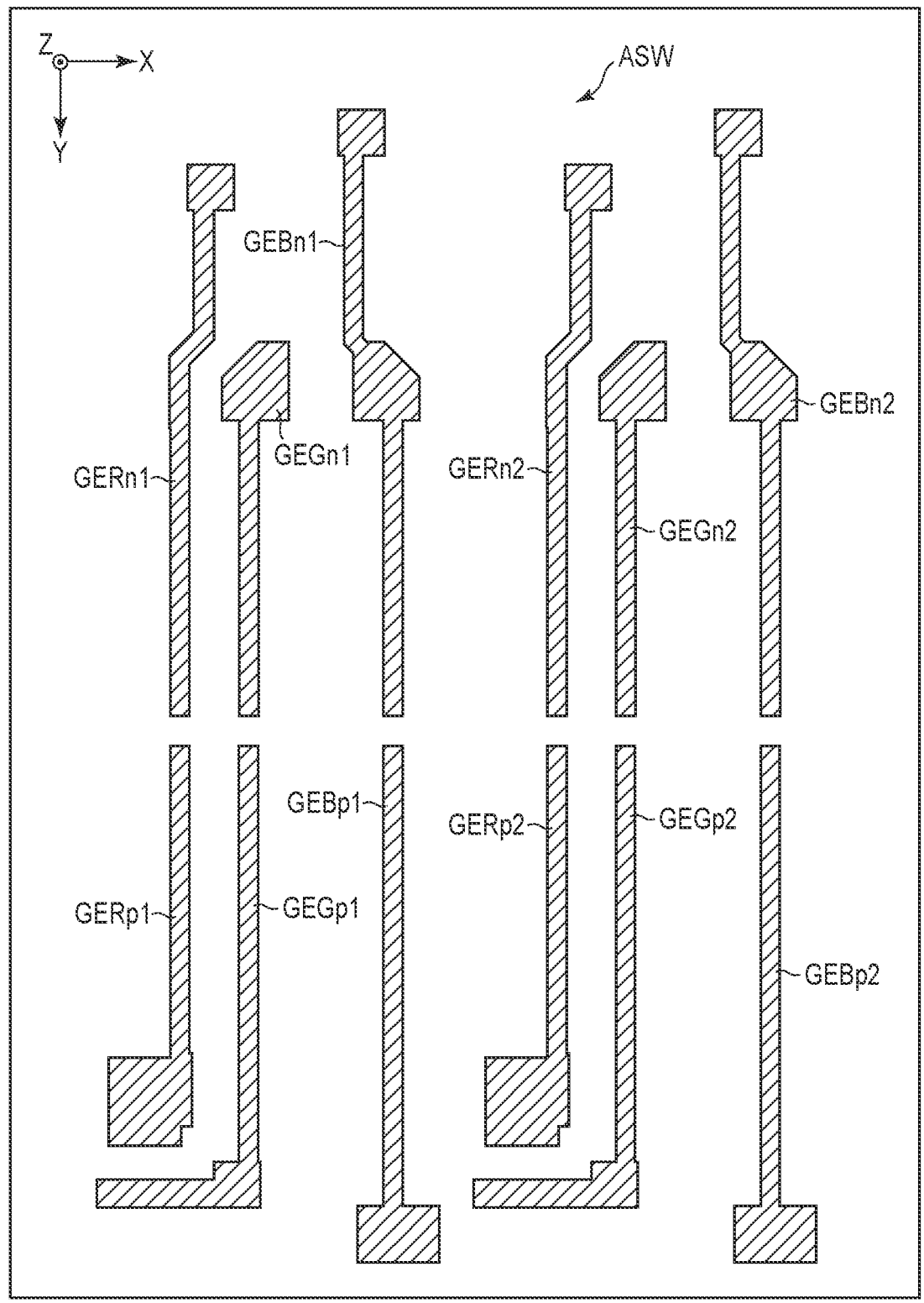
FIG. 13 is a plan view of the gate electrode of FIG. 11.
Figure 14:
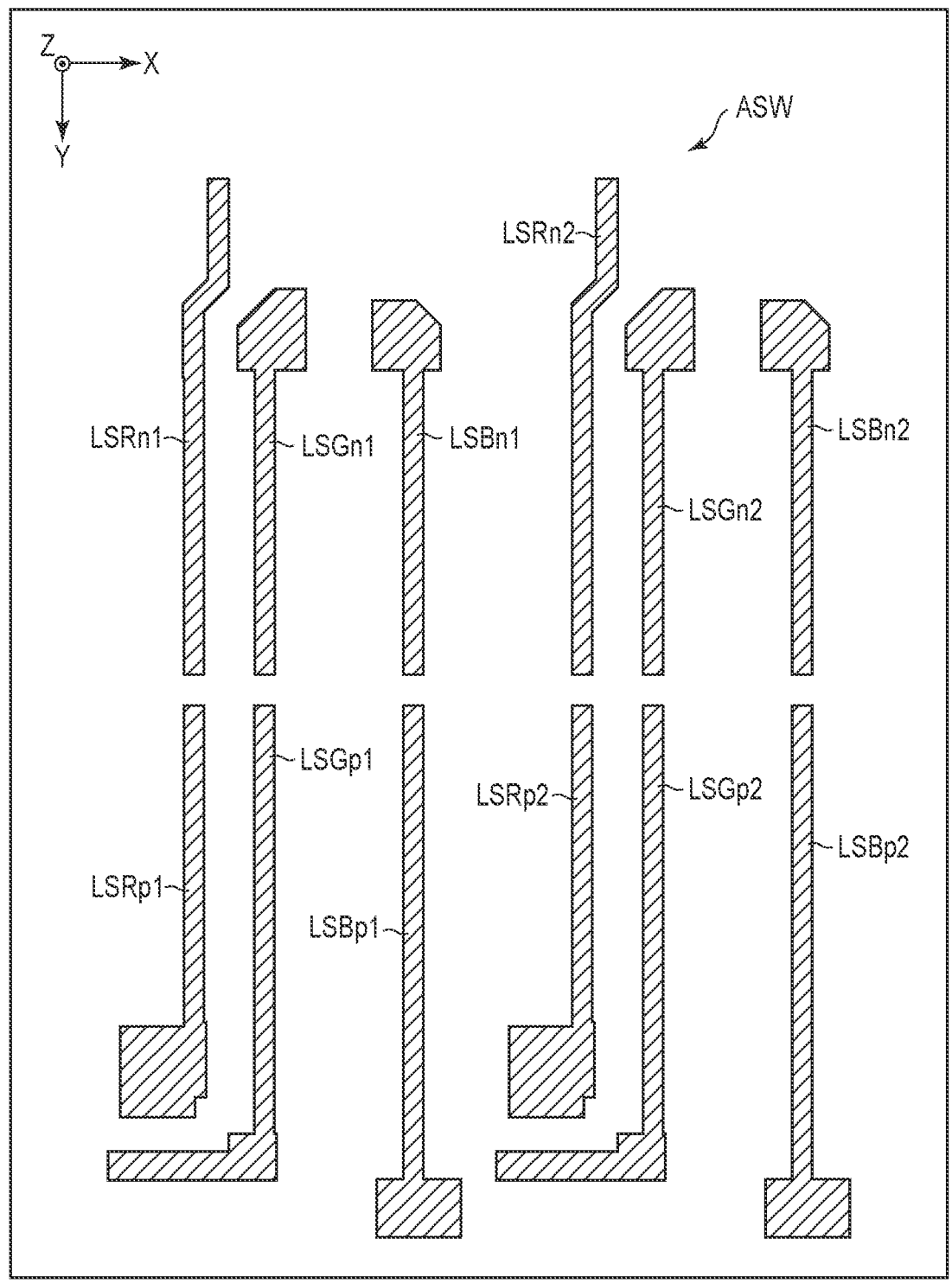
FIG. 14 is a plan view of the light shielding layer of FIG. 11.

FIG. 13 is a plan view of the gate electrode of FIG. 11. FIG. 14 is a plan view of the light shielding layer LS of FIG. 11. With respect to the p-channel transistor, the gate electrode GE and the light shielding layer LS overlapping each other have the same shape and the same area.

Figure 15:
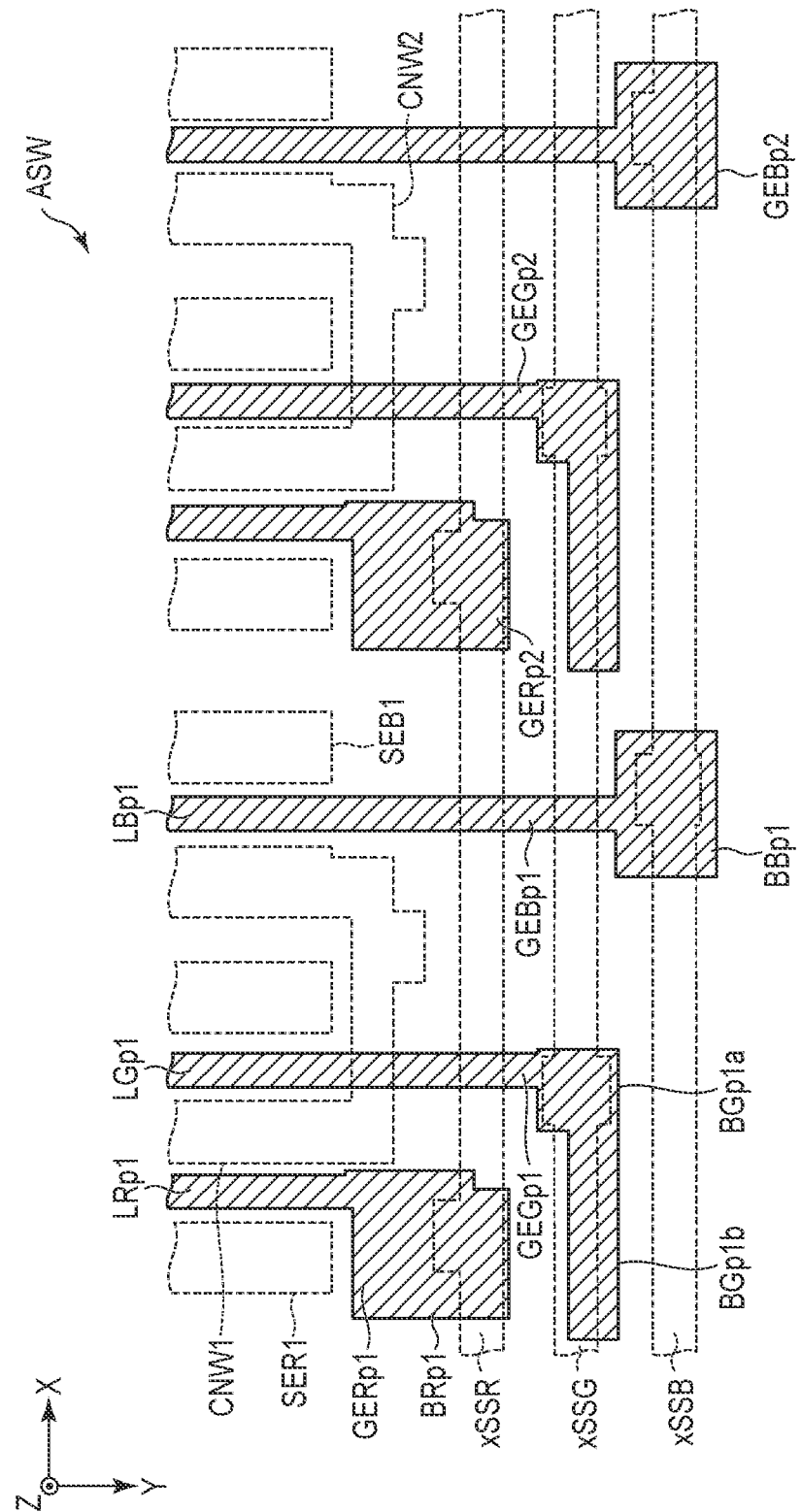
FIG. 15 illustrates a part of FIG. 11 in an enlarged manner.

FIG. 15 illustrates a portion of FIG. 11 in an enlarged manner. Specifically, FIG. 15 is an enlarged view of an area where the p-channel transistor is disposed. In FIG. 15, for easier understanding, the light shielding layer LS is omitted.

As shown in FIG. 15, the gate electrode GE includes, for example, a linear portion extending along the second direction Y and a projection portion projecting from the linear portion and extending along the first direction X.

A gate electrode GERp1 of FIG. 15 includes a linear portion LGp1 extending along the second direction Y, and a projection portion BRp1 connecting to a linear portion LRp1. The projection portion BRp1 extends in an opposite direction of the first direction X. The projection portion BRp1 overlaps a select line xSSR in a plan view.

A gate electrode GEGp1 includes a linear portion LGp1 and a projection portion BGp1*a* and a projection portion BGp1*b*. The linear portion LGp1 extends along the second direction Y. The projection portion BGp1*a* extends from the linear portion LGp1 in an opposite direction of the first direction X. The projection portion BGp1*b* is connected to the projection portion BGp1*a*, and extends from the projection portion BGp1*a* in the opposite direction of the first direction X. A length (width) of the projection portion Bp1*a* in the second direction Y is longer than a length (width) of the projection portion BGp1*b* in the second direction Y. The projection portion BGp1*a* and the projection portion BGp1*b* overlap a select line xSSR1 in a plan view.

A gate electrode GEBp1 includes a linear portion LBp1 extending along the second direction Y and a projection portion BBp1 connecting to the linear portion LBp1. The projection portion BBp1 extends in parallel to the first direction X. The projection portion BBp1 overlaps the select line xSSR in a plan view.

Note that, the gate electrode GERp2, the gate electrode GEGp2, and the gate electrode GEBp2 are shaped similarly to the gate electrode GERp1, the gate electrode GEGp1, and the gate electrode GEBp1, respectively, and are arranged similarly as well. Thus, the descriptions with respect to the gate electrode GERp2, the gate electrode GEGp2, and the gate electrode GEBp2 are the same as those with respect to the gate electrode GERp1, the gate electrode GEGp1, and the gate electrode GEBp1, and the detailed descriptions will be omitted here.

FIG. 16 illustrates a portion of FIG. 11 in an enlarged manner. Specifically, FIG. 16 is an enlarged view of an area where the n-channel transistor is disposed. In FIG. 16, for easier understanding, the light shielding layer LS is omitted. Note that, as in FIGS. 11, 13, and 14, the light shielding layer LS is shaped substantially the same as with the gate electrode GE.

In FIG. 16, a signal line SLR1 includes a first portion which is not shown, a second portion SLR1g, and a source electrode SER1. The first portion which is not shown is connected to the second portion SLR1g. The first portion and the source electrode SER1 are formed in the same line layer as with the select line SS, the connect line CNW, and the first portion WLs of the extracting line WL. The second portion SLR1g is formed in the same line layer as with the gate electrode GE.

A signal line SLG1 includes a first portion SLG1s, a second portion SLG1g1, a third portion SLG1g2, and a source electrode SEG1. The first portion SLG1s connects the second portion SLG1g1 and the third portion SLG1g2. The first portion SLG1s and the source electrode SEG1 are formed in the same line layer as with the select line SS, the connect line SNW, and the first portion WLs of the extracting line WL. The second portion SLG1g1 and the third portion SLG1g2 are formed in the same line layer as with the gate electrode GE. Note that the third portion SLG1g2 is further connected to a fourth portion (which is not shown) in the same line layer as with the first portion SLG1s.

A signal line SLB1 includes a first portion which is not shown, a second portion SLB1g, and a source electrode SEB1. The first portion which is not shown is connected to the second portion SLB1g. The first portion and the source electrode SEB1 are formed in the same line layer as with the select line SS, the connect line CNW, and the first portion WLs of the extracting line WL. The second portion SLB1g is formed in the same line layer as with the gate electrode GE.

Note that, connection relationships of the signal line SLR2, the signal line SLG2, and the signal line SLB2 are similar to those of the signal line SLR1, the signal line SLG1, and the signal line SLB1, respectively. Thus, the descriptions of the signal line SLR2, the signal line SLG2, and the signal line SLB2 are the same as those of the signal line SLR1, the signal line SLG1, and the signal line SLB1, and the detailed description will be omitted here.

In the example of FIG. 1, similar to the example of FIG. 9, the signal line SL has a portion to be replace with the same line layer as with the gate electrode GE in order to bridge the select line SS.

In the present example, the advantages obtained by the embodiment can be achieved.

Comparative Example

Figure 17:
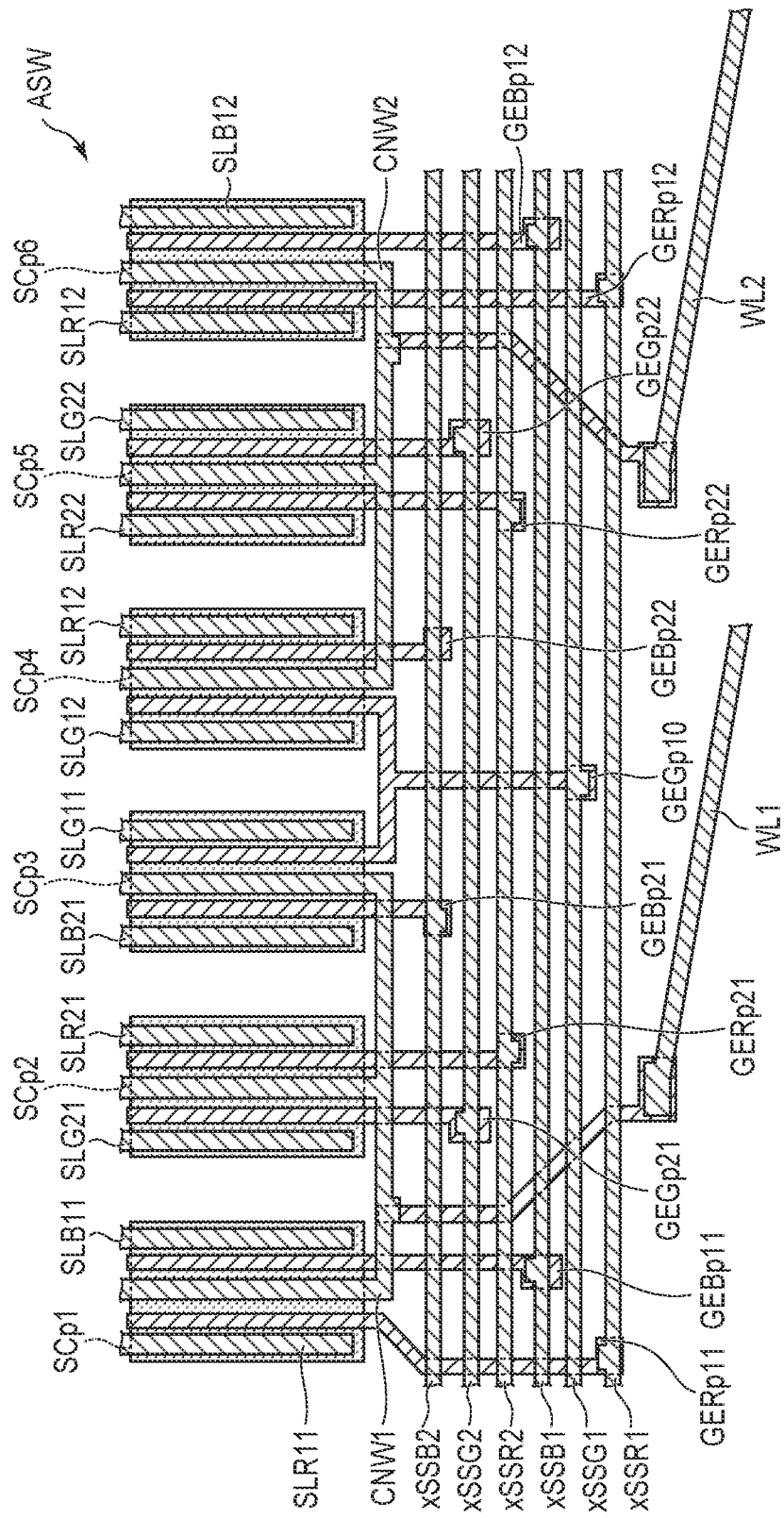
FIG. 17 is a plan view illustrates a structural example of a comparative example.

FIG. 17 is a plan view of a structural example of a comparative example. In the comparative example of FIG. 17, as compared to the structural example of FIG. 4, a light shielding layer is not shaped similar to a gate electrode, the gate electrode and the light shielding layer have different areas with respect to each transistor, and the gate electrode and the light shielding layer do not include a projection portion.

Figure 18A:
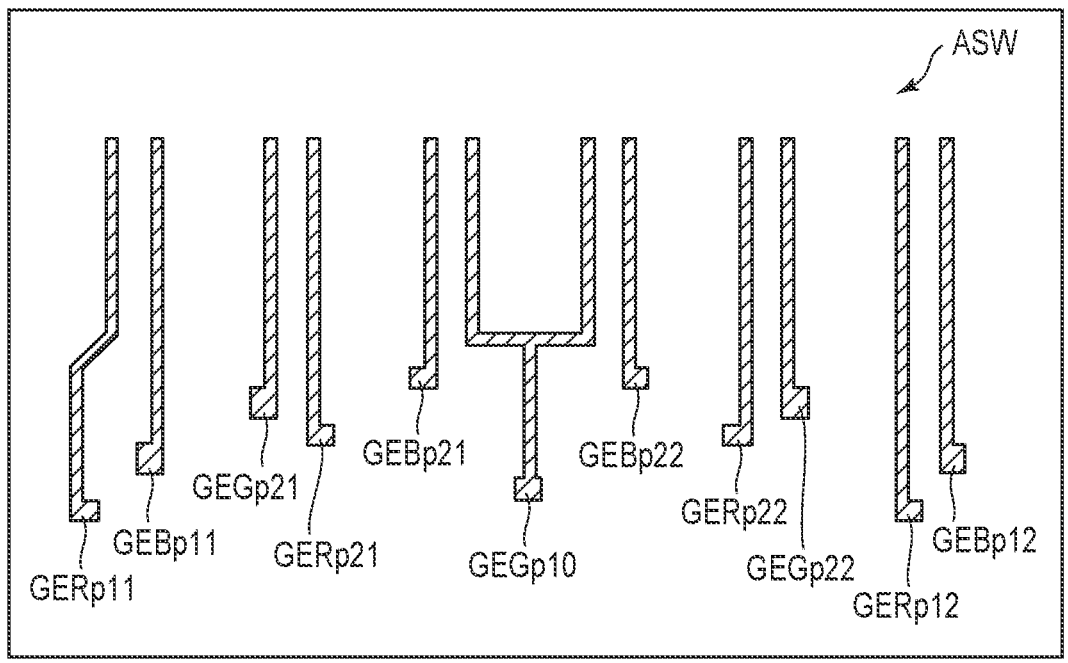
FIG. 18A is a plan view illustrating a gate electrode of a signal line switch circuit of FIG. 17.
Figure 18B:
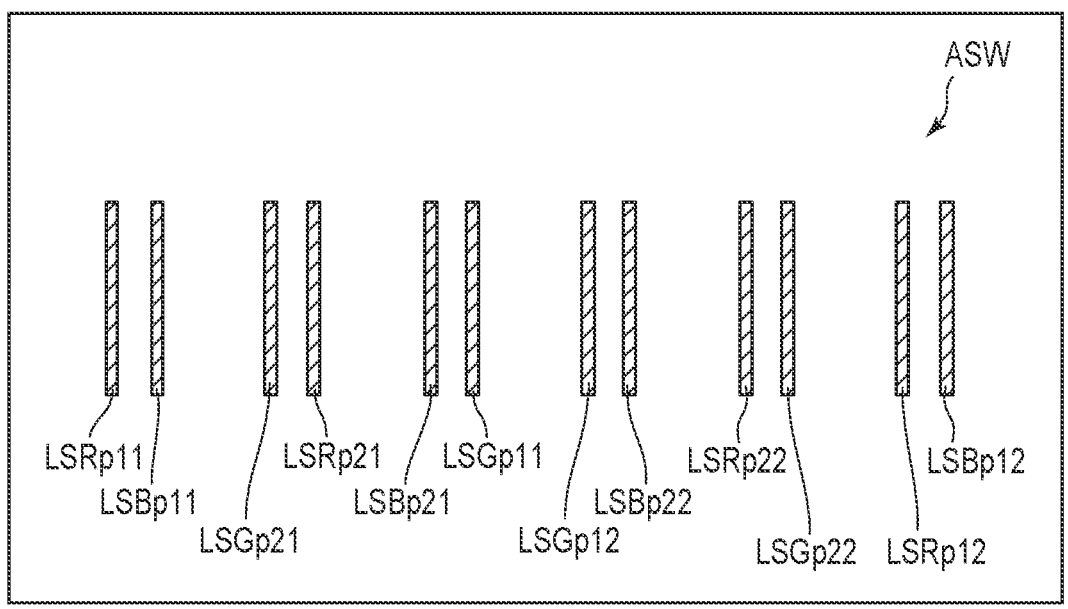
FIG. 18B is a plan view illustrating a light shielding layer of the signal line switch circuit of FIG. 17.

Referring to FIG. 17 and FIGS. 18A and 18B, the comparative example will be explained. FIGS. 18A and 18B are plan views illustrating the gate electrode and the light shielding layer, respectively, in a signal line switch circuit of FIG. 17. FIG. 18A is a plan view of the gate electrode GE of the comparative example, and FIG. 18B is a plan view of the light shielding layer LS of the comparative example. Although this is not shown, the light shielding layer LS overlaps corresponding semiconductor layer SC and gate electrode GE in a plan view. Note that, FIGS. 17, 18A, and 18B illustrate an area where the p-channel transistor is disposed.

As in FIGS. 17, 18A, and 18B, the signal line switch circuit ASW of the comparative example includes the light shielding layer LS with a shape which is different from that of the gate electrode GE. Furthermore, in the signal line switch circuit ASW of FIGS. 17, 18A, and 18B, the gate electrodes GE have different areas. Furthermore, the gate electrode GE and the light shielding layer LS do not include a projection portion.

Note that, as in FIG. 18B, light shielding layers corresponding to the gate electrode GEGp10 are the light shielding layer LSGp11 and the light shielding layer LSGp12.

As compared to the comparative example of FIGS. 17, 18A, and 18B, in the aforementioned embodiment, the capacitance of the gate electrode GE and the capacitance of the light shielding layer LS can be the same. With linear portions and projection portions of each of the gate electrode GE and the light shielding layer LS, current flowing to the transistor TT can be increased. Furthermore, with the gate electrodes GE of the transistor TT having the same area, uniformity of the transistors TT is possible. Thus, characteristics of the signal line switch circuit ASW can be improved. Furthermore, the display device DSP of the embodiment can improve the display quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a display area including a plurality of switching elements;
   a plurality of signal lines;
   a plurality of scan lines connected to the switching elements;
   a signal line switch circuit connected to the signal lines and located outside the display area; and
   a plurality of select lines extending in a first direction and arranged in a second direction, the plurality of select lines being connected to the signal line switch circuit, wherein
   the signal line switch circuit includes a plurality of transistors connected to the plurality of the signal lines,
   the plurality of transistors include a plurality of gate electrodes and a plurality of light shielding layers overlapping the plurality of gate electrodes,
   each of the plurality of the select lines is connected to each of the plurality of gate electrodes,
   at least one of the gate electrodes includes a first linear portion extending along the second direction, a first projection portion and a second portion oppositely extending from the tip of the first linear portion in an opposite direction of the first direction and the first projection portion projecting from the first linear portion and extending along the first direction, at least one of the first light shielding layers includes a second linear portion extending along the second direction, and a second projection portion projecting from the second linear portion and extending along the first direction, the first linear portion overlaps the second linear portion, the first projection portion overlaps the second projection portion, and the first projection portion and the second projection portion overlap at least one of the plurality of select lines.

2. The display device according to claim 1, wherein each of the light shielding layers does not contact the overlapping gate electrode.

3. The display device according to claim 1, wherein the light shielding layer is a back gate of the transistor, and is driven in a floating state.

4. The display device according to claim 3, further comprising a connect line connecting sources of the plurality of transistors, wherein each of the plurality of select lines is connected to each of the plurality of gate electrodes, the gate electrode having the first projection portion includes a third projection portion projecting from the first linear portion and extending along the first direction, the light shielding layer having the second projection portion includes a fourth projection portion extending from the second linear portion and extending along the first direction, and the third projection portion and the fourth projection portion overlap with each other between the connection line and one of the plurality of select lines.

5. The display device according to claim 1, wherein the transistor is a transmission gates each including an n-channel transistor and a p-channel transistor.

* * * * *